United States Patent
MacKenzie et al.

(10) Patent No.: US 8,164,423 B1
(45) Date of Patent: *Apr. 24, 2012

(54) MOS ELECTRONIC ARTICLE SURVEILLANCE, RF AND/OR RF IDENTIFICATION TAG/DEVICE, AND METHODS FOR MAKING AND USING THE SAME

(75) Inventors: J. Devin MacKenzie, San Carlos, CA (US); James Montague Cleeves, Redwood City, CA (US); Vik Pavate, San Mateo, CA (US); Christopher Gudeman, Los Gatos, CA (US); Fabio Zurcher, Brisbane, CA (US); Max Davis, San Francisco, CA (US); Dan Good, San Francisco, CA (US); Joerg Rockenberger, Redwood City, CA (US)

(73) Assignee: Kovio, Inc., San Jose, CA (US)

( * ) Notice: Subject to any disclaimer, the term of this patent is extended or adjusted under 35 U.S.C. 154(b) by 1044 days.

This patent is subject to a terminal disclaimer.

(21) Appl. No.: 12/103,662

(22) Filed: Apr. 15, 2008

Related U.S. Application Data

(63) Continuation of application No. 11/594,046, filed on Nov. 6, 2006, now Pat. No. 7,387,260, which is a continuation of application No. 10/885,283, filed on Jul. 6, 2004, now Pat. No. 7,152,804.

(60) Provisional application No. 60/553,674, filed on Mar. 15, 2004.

(51) Int. Cl.
*H04Q 3/00* (2006.01)
*G08B 13/14* (2006.01)

(52) U.S. Cl. .................... 340/10.1; 340/10.2; 340/10.5; 340/572.8; 340/7.32

(58) Field of Classification Search ............... 340/10.1, 340/10.2, 10.5, 572.8, 572.1, 7.32; 455/41.1; 235/487
See application file for complete search history.

(56) References Cited

U.S. PATENT DOCUMENTS 4,063,229 A 12/1977 Welsh et al.
(Continued)

OTHER PUBLICATIONS

Michael Fitzgerald; "The Sound and the Fury"; Yahoo News, Tech Tuesday; Apr. 1, 2004; 5 pgs.; http://story.news.yahoo.com/news?tmpl=story&u=/ttzd/20040401/tc_techtues_zd/123312& . . . .

(Continued)

*Primary Examiner* — Nam V Nguyen
(74) *Attorney, Agent, or Firm* — The Law Offices of Andrew D. Fortney, P.C.; Andrew D. Fortney

(57) ABSTRACT

A RF MOS- or nonlinear device-based surveillance and/or identification tag, and methods for its manufacture and use. The tag generally includes (a) an inductor, (b) a first capacitor plate coupled to the inductor, (c) a dielectric film on the first capacitor plate, (d) a semiconductor component on the dielectric film, and (e) a conductor that provides electrical communication between the semiconductor component and the inductor. The method of manufacture generally includes (1) depositing a semiconductor material (or precursor) on a dielectric film; (2) forming a semiconductor component from the semiconductor material/precursor; (3) forming a conductive structure at least partly on the semiconductor component; and (4) etching the electrically functional substrate to form (i) an inductor and/or (ii) a second capacitor plate. The method of use generally includes (i) causing/inducing a current in the present tag sufficient for it to generate detectable electromagnetic radiation; (ii) detecting the radiation; and optionally, (iii) selectively deactivating the tag. The present invention advantageously provides a low cost EAS/RFID tag capable of operating at MHz frequencies and in frequency division and/or frequency multiplication modes.

28 Claims, 8 Drawing Sheets

U.S. PATENT DOCUMENTS

| | | | | |
|---|---|---|---|---|
| 4,498,076 | A | 2/1985 | Lichtblau | |
| 4,567,473 | A | 1/1986 | Lichtblau | |
| 4,666,735 | A | 5/1987 | Hoover et al. | |
| 4,728,938 | A | 3/1988 | Kaltner | |
| 5,030,940 | A | 7/1991 | Siikarla | |
| 5,081,445 | A | 1/1992 | Gill et al. | |
| 5,099,225 | A | 3/1992 | Narlow et al. | |
| 5,111,186 | A | 5/1992 | Narlow et al. | |
| 5,218,189 | A | 6/1993 | Hutchison | |
| 5,257,009 | A | 10/1993 | Narlow | |
| 5,510,769 | A | 4/1996 | Kajfez et al. | |
| 5,608,379 | A | 3/1997 | Narlow et al. | |
| 5,625,341 | A | 4/1997 | Giles et al. | |
| 5,841,350 | A | 11/1998 | Appalucci et al. | |
| 5,861,809 | A | 1/1999 | Eckstein et al. | |
| 6,072,383 | A | 6/2000 | Gallagher, III et al. | |
| 6,072,394 | A | 6/2000 | Hasegawa et al. | |
| 6,091,607 | A | 7/2000 | McKeown et al. | |
| 6,103,587 | A | 8/2000 | Nakabeppu | |
| 6,163,260 | A * | 12/2000 | Conwell et al. | 340/572.8 |
| 6,177,870 | B1 | 1/2001 | Lian et al. | |
| 6,274,412 | B1 | 8/2001 | Kydd et al. | |
| 6,356,197 | B1 | 3/2002 | Patterson et al. | |
| 6,379,745 | B1 | 4/2002 | Kydd et al. | |
| 6,400,271 | B1 | 6/2002 | Davies, Jr. et al. | |
| 6,518,087 | B1 | 2/2003 | Furusawa et al. | |
| 6,535,108 | B1 | 3/2003 | Schrott et al. | |
| 6,767,775 | B1 | 7/2004 | Yudasaka et al. | |
| 6,891,237 | B1 | 5/2005 | Bao et al. | |
| 6,942,155 | B1 * | 9/2005 | Stewart et al. | 235/487 |
| 6,944,424 | B2 * | 9/2005 | Heinrich et al. | 455/41.1 |
| 6,970,089 | B2 * | 11/2005 | Carrender | 340/572.4 |
| 7,071,824 | B2 * | 7/2006 | Trosper | 340/571 |
| 2001/0040507 | A1 | 11/2001 | Eckstein et al. | |
| 2002/0163434 | A1 | 11/2002 | Burke | |
| 2003/0022494 | A1 | 1/2003 | Ying et al. | |
| 2003/0108664 | A1 | 6/2003 | Kodas et al. | |
| 2004/0072385 | A1 | 4/2004 | Bauer et al. | |
| 2005/0026317 | A1 | 2/2005 | Sirringhaus et al. | |

OTHER PUBLICATIONS

F. Albert Cotton, Geoffrey Wilkinson, Carlos A. Murillo and Manfred Bochmann; "Advanced Inorganic Chemistry"; pp. 776-778; A Wiley-Interscience Publication, John Wiley & Sons, Inc.; Copyright 1999; ISBN 0-471-19957-5; United States.

* cited by examiner

MOS ELECTRONIC ARTICLE SURVEILLANCE, RF AND/OR RF IDENTIFICATION TAG/DEVICE, AND METHODS FOR MAKING AND USING THE SAME

RELATED APPLICATIONS

This application is a continuation of U.S. application Ser. No. 11/594,046, filed Nov. 6, 2006 now U.S. Pat. No. 7,387,260, which is a continuation of U.S. application Ser. No. 10/885,283, filed Jul. 6, 2004, now U.S. Pat. No. 7,152,804, which claims the benefit of U.S. Provisional Application No. 60/553,674, filed Mar. 15, 2004, which is incorporated herein by reference in its entirety.

FIELD OF THE INVENTION

The present invention generally relates to the field of electronic article surveillance (EAS), radio frequency (RF) and/or RF identification (RFID) tags and devices. More specifically, embodiments of the present invention pertain to EAS, RF and/or RFID structures and methods for their manufacturing and/or production.

DISCUSSION OF THE BACKGROUND

Conventional low cost RF EAS and multibit chipless ID tags are fundamentally limited by their linear nature. They are composed of simple passive inductors, capacitors and resistors that resonate at the reader output frequency when that output frequency matches the resonant frequency of the tag. Tag detection is performed by detecting the disturbance in the oscillating field caused by the presence of the resonating tag (which couples to the reader field by mutual inductance, as in two loosely coupled transformer coils, and causes a change in the impedance of the tag detection circuit at the resonant frequency). This means that the tag resonance signal and the reader output are at the same frequency. Therefore, the detection efficiency and read range can be limited by the signal to noise ratio of the small tag signal with respect to the large reader signal. In some instances, these tags are read by pulsing the reader RF source, then listening for the ringing of the tag oscillator as the resonance decays.

Significant improvements in tag signal-to-noise, reduced error rates, and read range (the distance between a tag and reader) can occur through frequency dividing, multiplying, mixing or shifting in a tag. In this case, the reader puts out a central frequency that excites the tag circuit, such as the nationally and internationally recognized, relatively high field strength but low bandwidth carrier signals at 13.56 MHz. The tag then couples some of this energy into a frequency away from the central reader signal. The reader can then more easily filter out the large drive signal and more easily detect the different frequency "sideband" signal from the tag.

A direct way to get frequency shifts is to include a simple non-linear device into a simple LC circuit. Generally speaking, the introduction of any nonlinear circuit element will lead to the generation of harmonics of the carrier frequency and/or allow the resonant coupling of energy into the tag at frequencies away from the carrier frequency (e.g., tag resonance=the carrier frequency for generation of higher harmonics of the carrier frequency, or for the generation of a subharmonic at half the carrier frequency, tag resonance=½ of the reader signal frequency). A nonlinear device also can allow for mixing multiple incident signal frequencies to produce new spectral components or sidebands. Diodes have been used for these purposes, to produce RF and microwave shifted spectrum frequency tags with enhanced signal-to-noise, read-range and/or a lower false alarm rate than linear capacitor based tags. However, prior to the availability of printed active electronic components, the cost of integrating discrete passive components has prevented nonlinear tags from being used as low cost, disposable electronic article surveillance tags.

For a printed RF tag, the provision of a suitable substrate and/or an effective inductor coil can be a dominant factor in determining the cost of the tag. At 13.56 MHz and below, high Q inductors of a size <10 cm in lateral dimension (typically 50-100 µm thickness) require tens of microns of metal. High Q is generally required to get (1) good coupling between the reader field and the transponder tag and (2) high read range. Directly printing the nonlinear element on to a sheet or foil of metal can provide a cost effective way to provide an inductor, a relatively temperature resistant substrate, one electrode of the nonlinear device, and/or a source for the growth of the dielectric oxide.

As is known in the art, one can grow a dielectric film on a sheet of aluminum using high throughput, low cost per unit area processes (see e.g., U.S. Pat. Appl. Publication No. 2002/0163434, the relevant portions of which are incorporated herein by reference). However, a need still exists for low-cost or cost-effective integration of non-linear devices onto EAS RF tags. The present invention concerns a structure and process for an RF resonant and harmonic, subharmonic, signal mixing or sideband generating tag, utilizing printing technology.

SUMMARY OF THE INVENTION

Embodiments of the present invention relate to a MOS EAS, non-linear EAS, RF and/or RFID tag, and methods for its manufacture and use. The surveillance and/or identification device generally comprises (a) an inductor, (b) a first capacitor plate electrically connected to the inductor, (c) a dielectric film on the first capacitor plate, (d) a semiconductor component on the dielectric film, and (e) a conductor on the semiconductor component that provides electrical communication between the semiconductor component and the inductor. The method of manufacture generally comprises the steps of (1) depositing a semiconductor material or semiconductor material precursor on a dielectric film, the dielectric film being on an electrically functional substrate; (2) forming a semiconductor component from the semiconductor material or semiconductor material precursor; (3) forming a conductive structure at least partly on the semiconductor component, configured to provide electrical communication between the semiconductor component and the electrically functional substrate; and (4) etching, stamping, cutting or otherwise patterning the electrically functional substrate to form an inductor and/or a second capacitor plate capacitively coupled to the semiconductor component under one or more predetermined conditions. The method of use generally comprises the steps of (i) causing or inducing a current in the present device sufficient for the device to backscatter detectable electromagnetic radiation; (ii) detecting the detectable electromagnetic radiation; and optionally, (iii) selectively deactivating the device.

The present invention advantageously provides a low cost EAS, RF and/or RFID tag capable of operating (A) in frequency division and/or frequency multiplication modes, and/or (B) at a relatively high standard radio frequency (e.g., 13.56 MHz). These and other advantages of the present inven-

DETAILED DESCRIPTION OF THE PREFERRED EMBODIMENTS

Figure 1:
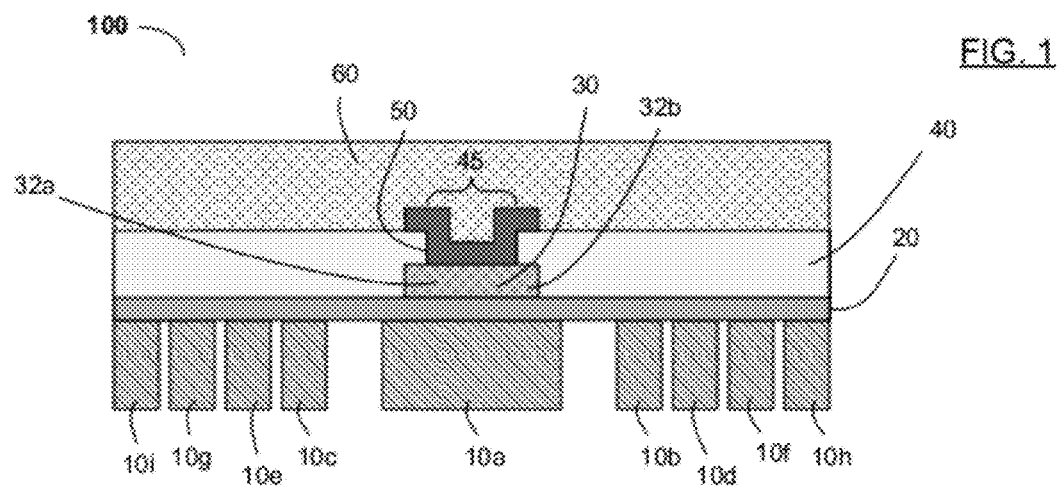
FIG. 1 shows a cross-sectional view of an exemplary embodiment of the present tag/device.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "coupled to," "connected to," and "in communication with" mean direct or indirect coupling, connection or communication unless the context indicates otherwise. These terms are generally used interchangeably herein, but are generally given their art-recognized meanings. Also, for convenience and simplicity, the terms "surveillance," "EAS," "RF," "RFID," and "identification" may be used interchangeably with respect to intended uses and/or functions of a device and/or tag, and the term "EAS tag" or "EAS device" may be used herein to refer to any EAS, RF and/or RFID tag and/or device. In addition, the terms "item," "object" and "article" are used interchangeably, and wherever one such term is used, it also encompasses the other terms. In the present disclosure, the phrase "consisting essentially of a Group IVA element" does not exclude intentionally added dopants, which may give the Group IVA element certain desired (and potentially quite different) electrical properties. Also, a "major surface" of a structure or feature is a surface defined at least in part by the largest axis of the structure or feature (e.g., if the structure is round and has a radius greater than its thickness, the radial surface[s] is/are the major surface of the structure).

The present invention concerns a surveillance and/or identification device, comprising (a) a first capacitor plate, (b) an inductor electrically connected to the first capacitor plate, (c) a dielectric film on the first capacitor plate, (d) a semiconductor component on the dielectric film, and (e) a conductor electrically connected to the semiconductor component, providing electrical communication between the semiconductor component and the inductor. The semiconductor-containing device generally enables the present tag to be operated (i) in frequency division, mixing and/or frequency multiplication modes, and/or (ii) at advantageous radio frequencies, such as 13.56 MHz, as will be explained in greater detail below.

In a further aspect, the present invention concerns a method of manufacturing a surveillance and/or identification device, generally comprising the steps of (1) depositing a semiconductor material or semiconductor material precursor on a dielectric film, the dielectric film being on an electrically functional substrate; (2) forming a semiconductor component from the semiconductor material or semiconductor material precursor; (3) forming a conductive structure configured to provide electrical communication between the semiconductor component and the electrically functional substrate; and (4) etching, stamping, cutting or otherwise patterning the electrically functional substrate to form (i) an inductor and/or (ii) a second capacitor plate capacitively coupled to the semiconductor component under one or more predetermined conditions. In an even further aspect, the present invention concerns a method of detecting an item or object, comprising the steps of generally comprising the steps of (A) causing or inducing a current in the present surveillance and/or identification device affixed to or associated with the item or object sufficient for the device to backscatter detectable electromagnetic radiation; (B) detecting the detectable electromagnetic radiation; and optionally, (C) selectively deactivating the device.

Even further aspects of the invention concern methods of manufacturing and using the present device. The invention, in its various aspects, will be explained in greater detail below with regard to exemplary embodiments.

Exemplary MOS EAS and/or RF Tags/Devices

One aspect of the invention relates to a surveillance and/or identification device, comprising (a) a first capacitor plate, (b) an inductor electrically connected to the first capacitor plate, (c) a dielectric film on the first capacitor plate, (d) a semiconductor component on the dielectric film, the semiconductor component being capacitively coupled to the first capacitor plate under one or more predetermined conditions, and (e) a conductor electrically connected to the semiconductor component, providing electrical communication between the semiconductor component and the inductor under the predetermined condition(s). Generally, the semiconductor component comprises a first Group IVA element, a III-V compound semiconductor, a II-VI (or chalcogenide compound) semiconductor such as ZnO or ZnS, or an organic or polyermeric semiconductor, and the inductor is in electrical communication with the first capacitor plate.

FIG. 1 shows an exemplary EAS tag 100, including capacitor plate 10a, inductor coil 10b-10h, dielectric film 20, semiconductor component 30, interlayer dielectric 40, capacitor plate 50, conductor 55 and passivation 60. A key feature of the present EAS tag 100 is semiconductor component 30, which enables tag 100 to be operated in frequency division and/or frequency multiplication modes. In certain embodiments, semiconductor component 30 further enables use of EAS tag 100 at advantageous radio frequencies, such as 100-400 KHz, 13.56 MHz or 900-950 MHz, as will be explained in greater detail below.

Generally, capacitor plate 10a and inductor 10b-10h comprise an electrically conductive material, preferably a first metal. As will be explained in greater detail with regard to the present method of manufacturing below, capacitor plate 10a and inductor 10b-10h (and, in most cases, interconnect pad 10j [see, e.g., FIGS. 9A-9B] and the inductor portion 10i electrically connecting inductor coil portion 10h to interconnect pad 10j; see, e.g., FIG. 9B) may be advantageously formed from a single sheet or foil of a metal or alloy. However, in alternative embodiments, the metal/alloy for capacitor plate 10a and inductor 10b-10i (and, optionally, interconnect pad 10j) may be conventionally deposited or printed onto the backside of dielectric film 20. The metal may comprise aluminum, titanium, copper, silver, chromium, molybdenum, tungsten, nickel, gold, palladium, platinum, zinc, iron, or a conventional alloy thereof. Other conductive materials may include conductive polymers such as doped polythiophenes, polyimides, polyacetylenes, polycyclobutadienes and polycyclooctatetraenes; conductive inorganic compound films such as titanium nitride, tantalum nitride, indium tin oxide, etc.; and doped semiconductors such as doped silicon, doped germanium, doped silicon-germanium, doped gallium arsenide, doped (including auto-doped) zinc oxide, zinc sulfide, etc. Also, the metal/alloy for capacitor plate 10a and inductor 10b-10g may comprise a multi-layer structure, such as aluminum, tantalum or zirconium deposited (e.g., by sputtering or CVD) onto a thin copper sheet or foil, or copper deposited (e.g., by electroplating) onto a thin aluminum sheet or foil. The metal for the capacitor plate 10a may be chosen at least in part based on its ability to be anodized into an effective dielectric. This includes Al, Ta and other metals. In preferred embodiments, the first metal comprises or consists essentially of aluminum.

Figure 9A:
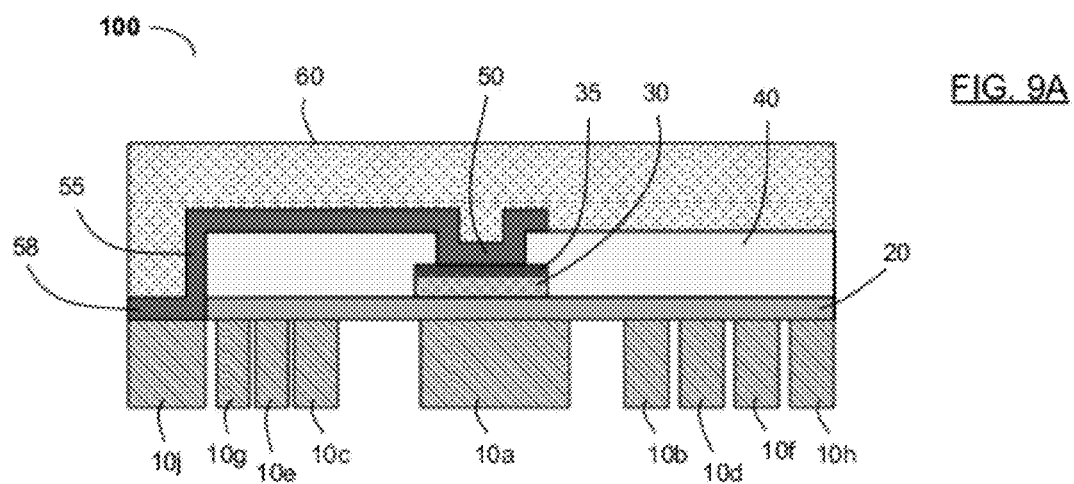
FIGS. 9A and 9B show cross-sectional and bottom views, respectively, of the structure of FIG. 8 with an inductor coil and capacitor plate etched into the conventional metal foil or sheet of FIGS. 2A-2B.
Figure 9B:
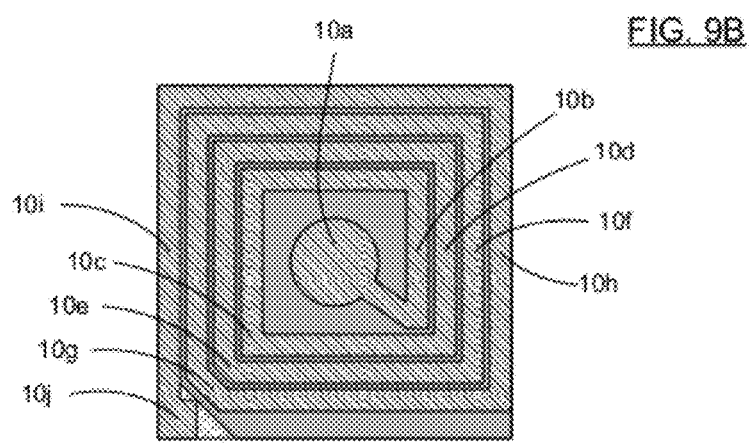

In the present surveillance and/or identification device 100, the inductor 10b-10i, capacitor plate 10a and/or interconnect pad 10j [see, e.g., FIGS. 9A-9B] may have a nominal thickness of from 5 to 200 µm (preferably from 20 to 100 µm) and/or a resistivity of 0.1-10 µohm-cm (preferably from 0.5 to 5 µohm-cm, and in one embodiment, about 3 µohm-cm). While the capacitor plate 10a of FIG. 1 is located substantially in the center of the device, it may be located in any area of the device, in accordance with design choices and/or preferences. Also, capacitor plate 10a may have any desired shape, such as round, square, rectangular, triangular, etc., with nearly any dimensions that allow it to fit in and/or on the EAS tag 100. Preferably, capacitor plate 10a has dimensions of (i) width, length and thickness, or (ii) radius and thickness, in which the thickness is substantially smaller than the other dimension(s). For example, capacitor plate 10a may have a radius of from 25 to 10,000 µm (preferably 50 to 5,000 µm, 100 to 2,500 µm, or any range of values therein), or a width and/or length of 50 to 20,000 µm, 100 to 10,000 µm, 250 to 5,000 µm, or any range of values therein.

Inductor 10b-10i is shown in FIG. 9B to comprise a coil having a first loop or ring 10b-10c, a second loop or ring 10d-10e, a third loop or ring 10f-10g, and a fourth loop or ring 10h-10i, but any suitable number of loops or rings may be employed, depending on application requirements and design choices/preferences. Inductor 10b-10i may take any form and/or shape conventionally used for such inductors, but preferably it has a coil, or concentric spiral loop, form. For ease of manufacturing and/or device area efficiency, the coil loops generally have a square or rectangular shape, but they may also have a rectangular, octagonal, circular, rounded or oval shape, some other polygonal shape, or any combination thereof, and/or they may have one or more truncated corners, according to application and/or design choices and/or preferences, as long as each successive loop is substantially entirely positioned between the preceding loop and the outermost periphery of the tag/device. Referring back to FIG. 1, the concentric loops or rings of the inductor coil 10b-10h may have any suitable width and pitch (i.e., inter-ring spacing), and the width and/or pitch may vary from loop to loop or ring to ring. However, in certain embodiments, the wire in each loop (or in each side of each loop or ring) may independently have a width of from 2 to 1000 µm (preferably from 5 to 500 µm, 10 to 200 µm, or any range of values therein) and length of 100 to 50,000 µm, 250 to 25,000 µm, 500 to 20,000 µm, or any range of values therein (as long as the length of the inductor wire does not exceed the dimensions of the EAS device). Alternatively, the radius of each wire loop or ring in the inductor may be from 250 to 25,000 µm (preferably 500 to 20,000 µm). Similarly, the pitch between wires in adjacent concentric loops or rings of the inductor may be from 2 to 1000 µm, 3 to 500 µm, 5 to 250 µm, 10 to 200 µm, or any range of values therein. Furthermore, the width-to-pitch ratio may be from a lower limit of about 1:10, 1:5, 1:3, 1:2 or 1:1, up to an upper limit of about 1:2, 1:1, 2:1, 4:1 or 6:1, or any range of endpoints therein.

Similarly, interconnect pad 10j (which is generally configured to provide electrical communication and/or physical contact with conductor 55) may have any desired shape, such a round, square, rectangular, triangular, etc., with nearly any dimensions that allow it to fit in and/or on the EAS tag 100 and provide electrical communication and/or physical contact with conductor 55. Preferably, interconnect pad 10j has dimensions of (i) width, length and thickness, or (ii) radius and thickness, in which the thickness is substantially smaller than the other dimension(s). For example, interconnect pad 10j may have a radius of from 25 to 2000 µm (preferably 50 to 1000 µm, 100 to 500 µm, or any range of values therein), or a width and/or length of 50 to 5000 µm, 100 to 2000 µm, 200 to 1000 µm, or any range of values therein.

Use of a substrate formed from a thin metal sheet or foil provides a number of advantages in the present invention. For example, one of the electrodes of the device (preferably, a gate and/or capacitor plate 10a) can be formed from the metal sheet or foil. A thin metal sheet or foil (which may have a major surface composed primarily of Al or Ta) provides a convenient source for dielectric film 20 by a relatively simple and straight-forward process technology, such as anodization. A metal sheet or foil also provides a conductive element that can be formed into an inductor coil or antenna using conventional metal film process technology. Also, metal sheets and/or foils have suitable high-temperature processing properties for subsequent processing steps (such as those described below with regard to the present method of manufacturing), unlike many inexpensive organic polymer substrates.

The dielectric film 20 preferably is designed and made such that application of a deactivating radio frequency electromagnetic field induces a voltage differential in the MOS capacitor across dielectric film 20 that will deactivate the tag/device (e.g., a voltage differential of about 4 to about 50 V, preferably about 5 to less than 30 V, more preferably about 10 to 20 V, or any desired range of endpoints therein) through breakdown of that film to shorted state or changed capacitance such that the tag circuit no longer resonates at the desired frequency. Thus, in certain embodiments, the dielectric film has (i) a thickness of from 50 to 400 Å and/or (ii) a breakdown voltage of from about 10 to about 20V. The dielectric film 20 may comprise any electrically insulative dielectric material, such as oxide and/or nitride ceramics or glasses (e.g., silicon dioxide, silicon nitride, silicon oxynitride, aluminum oxide, tantalum oxide, zirconium oxide, etc.), polymers such as polysiloxanes, parylene, polyethylene, polypropylene, undoped polyimides, polycarbonates, polyamides, polyethers, copolymers thereof, fluorinated derivatives thereof, etc. However, for reasons that will become apparent in the discussion of the manufacturing method discussed below, dielectric film 20 preferably comprises or consists essentially of aluminum oxide and/or a corresponding oxide of the metal used for capacitor plate 10a and/or inductor 10b-10i.

As mentioned above, the semiconductor component 30 generally comprises a semiconductor, preferably a Group IVA element. Preferably, the Group IVA element comprises silicon. Alternatively, the Group IVA element may consist essentially of silicon or silicon-germanium. Alternatively, the semiconductor component 30 may comprise or consist essentially of a III-V or II-VI compound semiconductor such as indium phosphide, zinc oxide, or zinc sulfide. In any case, whether the semiconductor component 30 comprises or consists essentially of an elemental or compound semiconductor, the semiconductor component 30 may further comprise an electrical dopant. In the case of silicon or silicon-germanium, the dopant may be selected from the group consisting of boron, phosphorous and arsenic, typically in a conventional concentration (e.g., light or heavy, and/or from $10^{-13}$ to $10^{-15}$, $10^{-15}$ to $10^{-17}$, $10^{-16}$ to $10^{-18}$, $10^{-17}$ to $10^{-19}$, $10^{-19}$ to $10^{-21}$ atoms/cm$^2$ or any range of values therein). For example, it may be advantageous to dope the semiconductor component 30 in order to improve the frequency response. A simple RC analysis suggests that conductivities of $\sim 2 \times 10^{-2}$ S/cm or higher may be required for high Q 13.56 MHz operation. This represents a lower limit in such an application. It may also be advantageous to heavily dope the near or upper surface region of the semiconductor component, or provide a second heavily-doped semiconductor component (e.g., having a dopant concentration within the last two ranges described above) adjacent to the first semiconductor component, to assist in low resistance contact formation and reduce the parasitic series resistance of the device.

Although the semiconductor component 30 may take nearly any form with nearly any dimensions, preferably it has a layered form, in that it may have dimensions of (i) width, length and thickness, or (ii) radius and thickness, in either case the thickness being substantially smaller than the other dimension(s). For example, the semiconductor component 30 may have a thickness of from 30 nm to 500 nm, preferably from 50 nm to 200 nm, but a radius of from 5 to 10,000 μm, (preferably 10 to 5,000 μm, 25 to 2,500 μm, or any range of values therein), or a width and/or length of 10 to 20,000 μm, 25 to 10,000 μm, 50 to 5,000 μm, or any range of values therein. Semiconductor component 30 may also comprise a multilayer structure, such as a metal silicide layer on a silicon-containing layer, successive n+/n− doped silicon films, or alternating n-doped and p-doped silicon films (each of which may comprise multiple layers of differing dopant concentrations, or which may have an intrinsic semiconductor layer between them) to form a conventional p-n, p-i-n or Schottky diode (in which case the semiconductor component 30 may have a second conductor in electrical communication with a different layer of semiconductor component 30 than conductor 55), etc. In the case of a diode structure, the MOS dielectric may be omitted or locally removed to facilitate electrical contact between the device electrodes and the internal semiconducting components. This could be facilitated with the use of one or more printed (or otherwise deposited) masking materials prior to the anodization, or through a local removal process after the dielectric formation. In the case where the semiconductor is in direct contact with the inductor/capacitor electrode metal, it may be advantageous to provide a metallic, intermetallic or other type of barrier layer to prevent detrimental interdiffusion or "spiking" through the device, such as is known to be the case for Al and Si at elevated temperatures.

Conductor 55 generally provides electrical communication between the semiconductor component 30 and the inductor 10b-10h, but in most of the present EAS and/or RFID tags, conductor 55 generally further comprises a second capacitor plate 50 (i) capacitively coupled (or complementary) to the first capacitor plate 10a and (ii) in substantial physical contact (e.g., having a major surface in contact) with the semiconductor component 30. While conductor 55 and capacitor plate 50 are preferably formed at the same time from the same material(s), they may be formed separately and/or from different materials. Also, while conductor 55 may comprise any electrically conductive material, generally conductor 55 comprises a second metal, which may be selected from the same materials and/or metals described above for the first capacitor plate 10a and/or inductor 10b-10h. In preferred embodiments, the second metal comprises or consists essentially of silver, gold, copper or aluminum (or a conductive alloy thereof).

Conductor 55 (and, by association, capacitor plate 50 and interconnect pad 58) may take nearly any form with nearly any dimensions, but preferably, it has a layered form, in that it may have dimensions of width, length and thickness, in which the thickness is smaller than the other dimension(s). For example, conductor 55 (and thus, second capacitor plate 50 and interconnect pad 58) may have a thickness of from 30 nm to 5000 nm, preferably from 50 nm to 2000 nm, more preferably from 80 nm to 500 nm. Second capacitor plate 50 may have radius, width and/or length dimensions that substantially match (or that are slightly greater than or slightly less than) those of first capacitor plate 10a (e.g., a radius of from 20 or 30 to 10,000 μm, 40 or 60 to 5,000 μm, 80 or 125 to 2,500 μm, or any range of values therein; or a width and/or length of 40 or 60 to 20,000 μm, 80 or 125 to 10,000 μm, 150 or 250 to 5,000 μm, or any range of values therein).

Furthermore, in addition to second capacitor plate 50, conductor 55 may comprise (i) a pad portion 58 for electrical communication with inductor 10b-10h and (ii) one or more wire portions electrically connecting capacitor plate 50 and pad portion 58. As for other conductive structures in the present device, the wire portion(s) may have a width of from 2 to 1000 μm (preferably from 5 to 500 μm, 10 to 200 μm, or any range of values therein) and length of 100 to 25,000 μm, 250 to 20,000 μm, 500 to about 15,000 μm, or any range of values therein (as long as the length of the inductor wire does not exceed the dimensions of the EAS device 100, or half of such dimensions if capacitor plate 50 is in the center of device 100, as the case may be). Pad portion 58 generally has the same thickness as conductor 55, and may have any suitable shape (e.g., square, rectangular, round, etc.). In various embodiments, pad portion 58 has a width and/or length of from 50 to 2000 μm, 100 to about 1500 μm, 200 to 1250 μm, or any range of values therein; or a radius of from 25 to 1000 μm, 50 to 750 μm, 100 to 500 μm, or any range of values therein. In general, it may be advantageous to minimize the parasitic capacitance resulting from overlap of the capacitor pad not directly over the semiconductor component and wire connection by minimizing length and width of these features.

In the present EAS device, the combination of the semiconductor component 30 and the second capacitor plate 50 effectively forms a nonlinear capacitor with the corresponding portion of the dielectric film 20 and the complementary first capacitor plate 10*a*. Below a predetermined threshold voltage (or a predetermined voltage differential across dielectric film 20 and semiconductor component 30), second capacitor plate 55 functions as the capacitor plate complementary to first capacitor plate 10*a*, and dielectric film 20 and semiconductor component 30 together function as the capacitor dielectric between first and second capacitor plates 10 and 55. However, above the predetermined threshold voltage (or predetermined voltage differential), charge carriers (e.g., electrons) may be collected and/or stored in semiconductor component 30, generally near the interface of the semiconductor component 30 and dielectric film 20, thereby changing the capacitive properties of the circuit. Thus, the capacitance and/or other capacitive properties of the circuit typically vary in dependence on the voltage across the capacitor, effectively making a nonlinear capacitor from the combination of second capacitor plate 55, semiconductor component 30, dielectric film 20 and first capacitor plate 10*a*. In various embodiments, the predetermined threshold voltage is from −10V to 10V, from about −5V to about 5V, from about −1V to about 1V, or any range of voltages therein. Alternatively, the highest slope of the C-V curve of such a capacitor may occur at a voltage of from −5V to 5V, −1V to 1V, any range of voltages therein, or ideally, about 0V. Electrical dopant concentrations in the semiconductor component may also be used to control the shape and slope(s) of the CV curve. The transition with changing bias across the device from the high capacitance state of the MOS capacitor device when charge is being stored at the oxide-semiconductor interface (such as in the accumulation mode of MOS device operation), to the mode where incremental charge is being stored at location(s) extending through the semiconductor (the so-called depletion mode), and therefore with a decreasing capacitance, can be a direct function of the dopant profile.

The present EAS device may further comprise an interlayer dielectric 40 between the dielectric film 20 and the conductor 55. The interlayer dielectric 40 generally includes a via 45 at a location overlapping with at least part of the semiconductor component 30. FIG. 1 shows a first embodiment in which the semiconductor component 30 has a peripheral region (or periphery) 32*a*-32*b*, and the interlayer dielectric 40 is also between the periphery 32*a*-32*b* and the conductor 50. In an alternative embodiment (see, e.g., FIG. 11A), the semiconductor component 30 is entirely within the via 45. Referring back to FIG. 1, via 45 preferably has a radius, or alternatively, width and/or length dimensions, substantially the same as second capacitor plate 50. However, in the embodiment of FIG. 1, semiconductor component 30 may have radius, width and/or length dimensions greater than those of via 45.

The interlayer dielectric 40 may comprise any electrically insulative material providing the desired dielectric properties, as for dielectric film 20. However, thickness tolerances of interlayer dielectric 40 are not as small in absolute terms as those of dielectric film 20, so polymers such as polysiloxanes, parylene, fluorinated organic polymers, etc., may be more easily used in interlayer dielectric 40. However, in preferred embodiments, interlayer dielectric 40 comprises an oxide and/or nitride of a second Group IVA element, which may further contain conventional boron and/or phosphorous oxide modifiers in conventional amounts. Thus, the second Group IVA element may comprise or consists essentially of silicon, in which case the interlayer dielectric 40 may comprise or consist essentially of silicon dioxide, silicon nitride, silicon oxynitride, a borosilicate glass, a phosphosilicate glass, or a borophosphosilicate glass (preferably silicon dioxide). To minimize parasitic capacitances with inductor 10*b*-10*i*, interlayer dielectric 40 may have a thickness of at least 1 μm, and preferably from 2 to 25 μm, 5 to 10 μm, or any range of values therein.

Figure 11A:
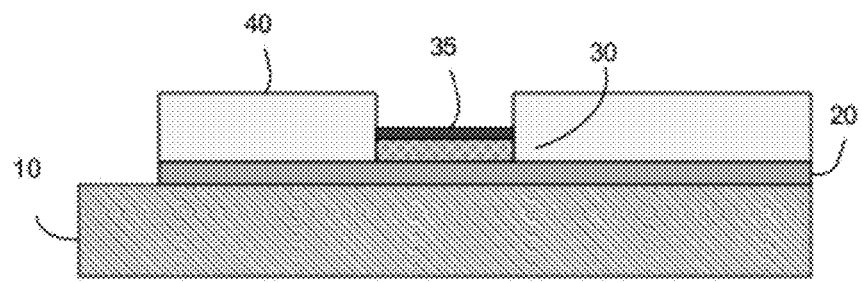
FIGS. 11A and 11B show cross-sectional and top views, respectively, of the alternative embodiment of FIGS. 10A-10B with a semiconductor component in a via in the interlayer dielectric.
Figure 11B:
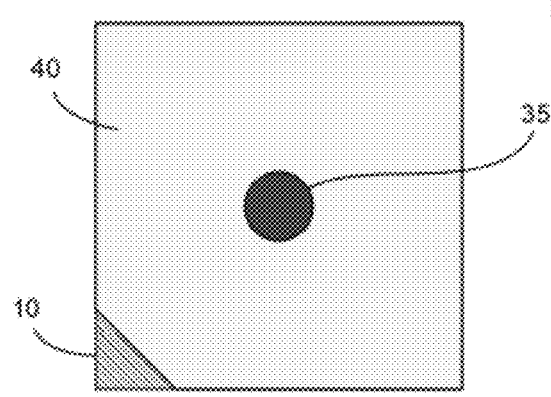

The embodiment shown in FIG. 1A has certain advantages over the alternative embodiment that would result from the structure of FIGS. 11A-B. For example, in the case of a printed semiconductor component, potentially detrimental edge morphology, such as edge spikes and/or relatively appreciable thickness variations near the feature edge, may be present. By positioning the active area of the MOS nonlinear capacitor away from these potentially detrimental edge regions (e.g., when the ILD via hole 45 is smaller than the printed semiconductor feature dimensions), the impact of edge morphology can be reduced. However, as will be discussed below with regard to FIGS. 11A-B, the alternative embodiment produced from the structure of FIGS. 11A-B also has certain advantages as well. For example, nonlinear capacitor variations may be minimized in the alternative embodiment of FIGS. 11A-B, thereby improving suitability for applications requiring minimal deviations from an ideal and/or predetermined resonance frequency.

The present device may further comprise a passivation layer 60 over the conductor 55 and interlayer dielectric 40. Passivation layer 60 is conventional, and may comprise an organic polymer (such as polyethylene, polypropylene, a polyimide, copolymers thereof, etc.) or an inorganic dielectric (such as aluminum oxide, silicon dioxide [which may be conventionally doped and/or which may comprise a spin-on-glass], silicon nitride, silicon oxynitride, or a combination thereof as a mixture or a multilayer structure). Passivation layer 60 generally has the same width and length dimensions as the EAS device, and it may also have any thickness suitable for EAS, RF and/or RFID tags or devices. In various embodiments, passivation layer 60 has a thickness of from 3 to 100 μm, from 5 to 50 μm, 10 to 25 μm, or any range of values therein.

The present device may also further comprise a support and/or backing layer (not shown) on a surface of the inductor 10*b*-10*h* opposite the dielectric film 20. The support and/or backing layer are conventional, and are well known in the EAS and RFID arts (see, e.g., U.S. Pat. Appl. Publication No. 2002/0163434 and U.S. Pat. Nos. 5,841,350, 5,608,379 and 4,063,229, the relevant portions of each of which are incorporated herein by reference). Generally, such support and/or backing layers provide (1) an adhesive surface for subsequent attachment or placement onto an article to be tracked or monitored, and/or (2) some mechanical support for the EAS device itself. For example, the present EAS tag may be affixed to the back of a price or article identification label, and an adhesive coated or placed on the opposite surface of the EAS tag (optionally covered by a conventional release sheet until the tag is ready for use), to form a price or article identification label suitable for use in a conventional EAS system.

Exemplary Methods for Making a MOS EAS and/or RF Tag/Device

In one aspect, the present invention concerns a method for making a surveillance and/or identification device, comprising the steps of: (a) depositing a semiconductor material or semiconductor material precursor on a dielectric film, the dielectric film being on an electrically functional substrate; (b) forming a semiconductor component from the semiconductor material or semiconductor material precursor; and (c) forming a conductive structure at least partly on the semiconductor component, the conductive structure being configured to provide electrical communication between the semiconductor component and the electrically functional substrate; and (4) etching the electrically functional substrate to form (i) an inductor and/or (ii) a second capacitor plate capacitively coupled to the semiconductor component under one or more predetermined conditions. In a preferred embodiment, the depositing step comprises printing a liquid-phase Group IVA element precursor ink on the dielectric film. Printing an ink, as opposed to blanket deposition, photolithography and etching, saves on the number of processing steps, the length of time for the manufacturing process, and/or on the cost of materials used to manufacture the EAS device. Thus, the present method provides a cost-effective method for manufacturing nonlinear EAS devices.

A first exemplary method for manufacturing the present EAS tag is described below with reference to FIGS. 2A-9B. An alternative process for a subset of the exemplary method steps is described below with reference to FIGS. 10A-11B.

The Substrate

Figure 2A:
FIGS. 2A and 2B show cross-sectional and top views, respectively, of a conventional metal sheet or foil substrate.
Figure 2B:
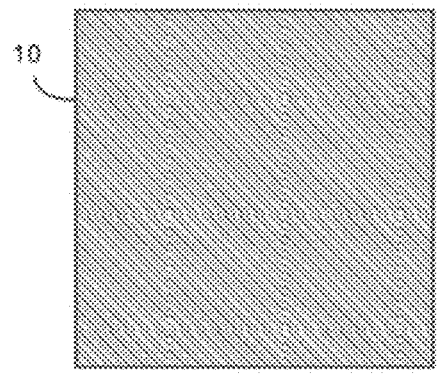

FIGS. 2A-2B respectively show cross-sectional and top-down views of an electrically functional substrate 10, which in various embodiments, comprises a metal sheet or metal foil (and in one embodiment, a thin aluminum sheet). Prior to subsequent processing, substrate 10 may be conventionally cleaned and smoothed. This surface preparation may be achieved by chemical polishing, electropolishing and/or oxide stripping to reduce surface roughness and remove low quality native oxides. A description of such processes is given in, "The Surface Treatment and Finishing of Aluminum and Its Alloys," by P. G. Sheasby and R. Pinner, sixth edition, ASM International, 2001, the relevant portions of which are incorporated herein by reference.

As described above, the metal sheet/foil may have a nominal thickness of 20-100 μm and/or a resistivity of 0.1-10 μohm-cm. A metal sheet/foil is advantageously used in the present method because it may be (1) electrochemically anodized to reproducibly and/or reliably provide a suitable dielectric film, (2) later formed into the inductor and lower capacitor plate, and/or (3) serve as a mechanically and/or physically stable substrate for device processing during the first part of the manufacturing process.

Forming the Dielectric Film

Figure 3A:
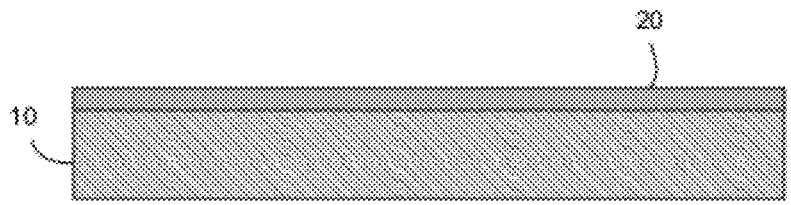
FIGS. 3A and 3B show cross-sectional and top views, respectively, of the aluminum sheet or foil substrate of FIGS. 2A-2B with a thin dielectric film on one surface.
Figure 3B:
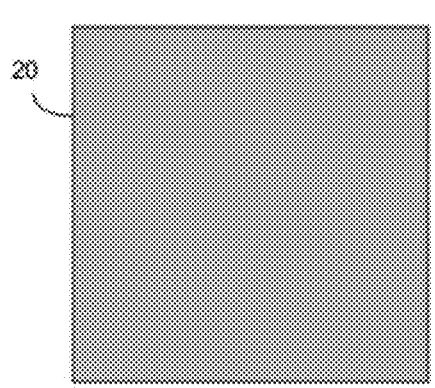

Referring now to FIGS. 3A-3B (which respectively show cross-sectional and top-down views), the method further comprises the step of forming a dielectric film 20 on the electrically functional substrate 10. In preferred embodiments, the dielectric film 20 has a thickness of from 50 to 500 Å and/or a breakdown voltage of from about 5V to less than 50V, preferably from 10V to 20V. In one implementation in which substrate 10 comprises or consists essentially of a metal sheet or metal foil, the step of forming the dielectric film comprises anodizing the metal sheet or metal foil. A thin anodized dielectric metal oxide film having a controlled breakdown in a voltage range preferably from about 10 to about 20 V provides a reliable deactivation mechanism for the EAS tag.

Anodization to form a MOS dielectric and/or deactivation dielectric is a known process. A typical thickness for the dielectric film 20 is from 100 to 200 Å, which may correspond to a breakdown voltage in the above range, particularly when the dielectric film 20 consists essentially of aluminum oxide. In such electrochemical anodization, a rule of thumb is that one may obtain a thickness of 1.3 nm/V+2 nm (see J. Appl. Phys., Vol. 87, No. 11, 1 Jun. 2000, p. 7903, the relevant portions of which are incorporated herein by reference).

Barrier-type anodic oxide films are usually formed in dilute solutions of organic acids, like tartaric acid or citric acid, or in dilute solution of inorganic salts or acids (for example, ammonium pentaborate or boric acid). Ethylene glycol may be mixed with water in those solutions, or even completely replace the water, as is often the case of a pentaborate salt. The pH of the electrolyte is usually adjusted to be between 5 and 7. The electrolytic bath is usually, but not exclusively, kept at room temperature. The Al foil or substrate is connected to the positive pole of a power supply (the anode) while the counter-electrode (usually a metal grid) is connected to the negative pole of the power supply (the cathode). Anodized films may be formed in a continuous and/or multi-step process. In an exemplary two step-process, during a first period of time, the voltage is increased at a constant current up to a voltage corresponding to about the desired thickness according to the formula: $V_{final}$=[desired thickness in nm]/1.2-1.4, where $V_{final}$ is i the final voltage at the end of the first period of time. The constant current during this first phase may be from 10 microamps/cm$^2$ to 1 amp/cm$^2$, preferably from 100 microamps/cm$^2$ to 0.1 amp/cm$^2$. The rate of voltage increase may be from 0.1 to 100 V/min, preferably from about 10 to 50 V/min. In one implementation, the voltage increase rate is about 30 V/min. $V_{final}$ typically has a value at least that of the desired maximum breakdown voltage of the anodized film, and usually, about 1 to 2 times that desired maximum breakdown voltage. Then, during a second period of time, anodization current decreases while a constant voltage (equal to the final voltage from the first period of time) is maintained, during which period the dielectric properties are improved. The second period of time may be from 10 seconds to 60 minutes and in one implementation, about 15 min.

The dielectric breakdown voltage may be directly related to the voltage applied during the electrochemical anodization process to form the dielectric ($V_{final}$). For example, as discussed above, the breakdown voltage generally cannot exceed $V_{final}$. Typically, however, the breakdown voltage is from 50 to about 90% of $V_{final}$, more typically about 60 to about 80% of $V_{final}$. There may also be a relationship between the breakdown voltage and the current applied in the first phase of anodization, in that the higher the current, generally the closer the breakdown voltage comes to $V_{final}$.

Forming the Semiconductor Component

Figure 4A:
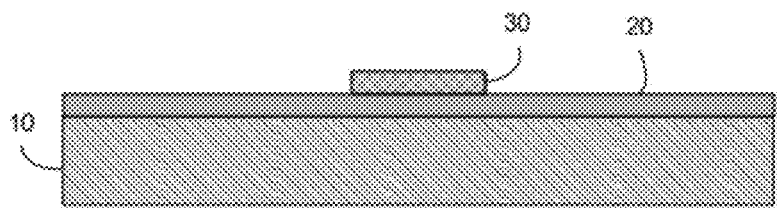
FIGS. 4A and 4B show cross-sectional and top views, respectively, of the substrate of FIGS. 3A-3B with a first semiconductor component layer printed on the anodized aluminum oxide film.
Figure 4B:
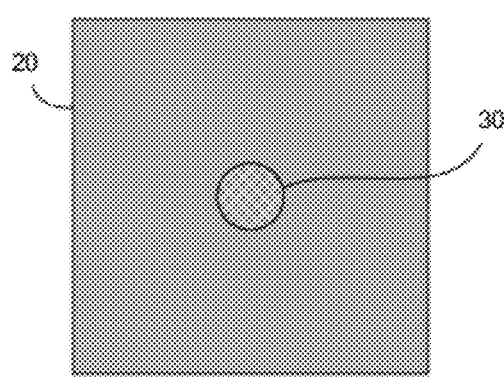
Figure 13:
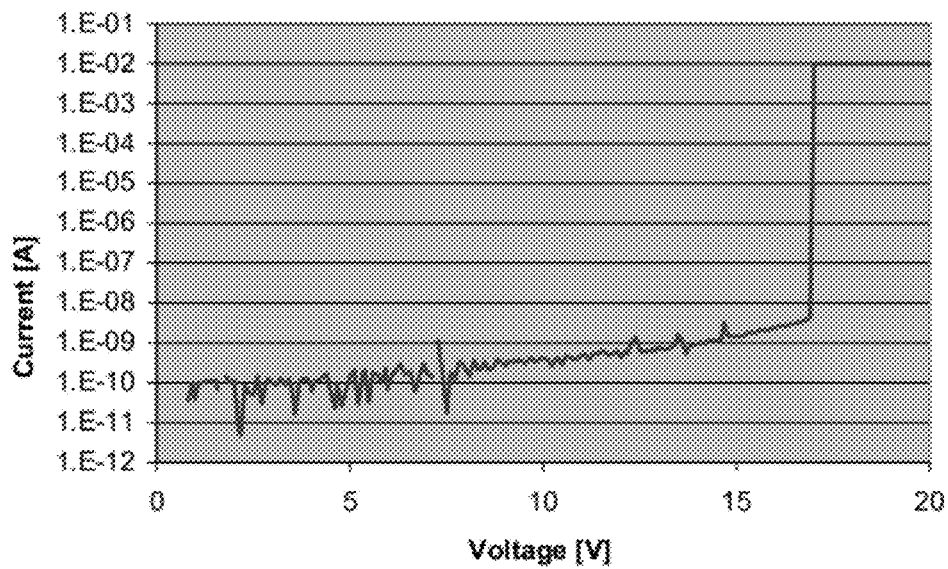

Referring now to FIGS. 4A-4B (which respectively show cross-sectional and top-down views of the EAS device 100), the method further comprises the step of depositing a semiconductor component 30 on the dielectric film 20. As described above, the component 30 may comprise any material that provides a nonlinear response to an RF field. In general, any method for depositing the semiconductor component material may be used, such as printing, or conventional blanket deposition (e.g., by chemical vapor deposition [CVD], low pressure CVD, sputtering, electroplating, spin coating, spray coating, etc.), photolithography and etching. Certain photopatternable functional materials that may have nonlinear properties, and methods for their deposition and use, are disclosed in copending U.S. application Ser. No. 10/749,876, filed Dec. 31, 2003, the relevant portions of which are incorporated herein by reference. Typical semiconductor component film thicknesses may be from 50 to 200 nm. The film thickness may be chosen to optimize (i) the maximum swing of the capacitance and/or (ii) the slope of the C(V) curve (see, e.g., FIG. 13 and the discussion thereof below) and the series resistance-limited frequency response of the EAS tag.

In preferred embodiments, semiconductor component 30 comprises a semiconductor material, such as one or more Group IVA elements (e.g., silicon and/or germanium), a so-called "III-V" material (e.g., GaAs), an organic or polymeric semiconductor, etc. Thus, in one implementation, depositing the semiconductor material or semiconductor material precursor comprises depositing a liquid-phase Group IVA element precursor ink on the dielectric film. Suitable liquid-phase Group IVA element precursor inks and methods for printing such inks are disclosed in copending U.S. application Ser. Nos. 10/616,147 and 10/789,317, respectively filed Jul. 8, 2003 and Feb. 27, 2004, the relevant portions of each of which are incorporated herein by reference. Use of a precursor ink is advantageous in that the depositing step may thereby comprise printing the liquid-phase Group IVA element precursor ink on the dielectric film, as discussed above. Printing may comprise inkjet printing, microspotting, stenciling, stamping, syringe dispensing, pump dispensing, screen printing, gravure printing, offset printing, flexography, laser forward transfer, or local laser CVD.

When using a Group IVA element precursor ink, the step of forming the semiconductor component generally comprises curing the Group IVA element precursor, and may further comprise drying the liquid-phase Group IVA element precursor ink before curing the Group IVA element precursor. See copending U.S. application Ser. Nos. 10/616,147, 10/789,317 and 10/789,274, respectively filed Jul. 8, 2003, Feb. 27, 2004 and Feb. 27, 2004, the relevant portions of each of which are incorporated herein by reference. Typically, although not necessarily always, the liquid-phase Group IVA element precursor ink further comprises a solvent, preferably a cycloalkane. In preferred implementations, the Group IVA element precursor comprises a compound of the formula $A_n H_{n+y}$, where n is from 3 to 12, each A is independently Si or Ge, and y is an even integer of from n to 2n+2, more preferably a compound of the formula $(AH_z)_n$, where n is from 5 to 10, each A is independently Si or Ge, and each of the n instances of z is independently 1 or 2. Use of local printing of a liquid semiconductor precursor, preferably a silane-based precursor to Si or doped Si (see, e.g., U.S. application Ser. Nos. 10/616,147 and 10/789,317), directly onto dielectric film 20 to form part of an RF active MOS structure is cost effective due to efficient semiconductor precursor materials usage and the combination of deposition and patterning into one inexpensive printing step.

The semiconductor deposition process may also require UV or thermal curing processes to fix the layer and/or convert the precursor to an active semiconducting layer and/or remove unwanted precursor components or byproducts such as carbon (elemental carbon or a carbon-containing compound) or excess hydrogen (particularly if laser recrystallization is to be used immediately after semiconductor film formation). In such embodiments, the semiconductor or semiconductor precursor may be also deposited by spin coating with simultaneous irradiation, as disclosed in copending U.S. application Ser. No. 10/789,274, filed on Feb. 27, 2004, (the relevant portions of which are incorporated herein by reference), or by other techniques, including bath deposition. Furthermore, the semiconductor may be deposited by other processes including large area (e.g., blanket) or local sputtering, CVD, laser forward transfer, or other processes.

It is generally desirable to increase the frequency response of the MOS capacitor circuit on the EAS device and provide a low series resistance for the circuitry in the EAS device to enable high frequency operation (e.g., in the range of 125 KHz and above). To achieve sufficiently low series resistance and/or increased frequency response, one may recrystallize the semiconductor material used for the semiconductor component 30. Such recrystallization can improve the carrier mobility and/or dopant activation of the semiconductor. Mobilities approaching 10 $cm^2$/vs and higher may be required for low dissipation and/or effective high Q. Low dissipation generally requires low series resistance, preferably less than 5 Ohms for the entire circuit, along with a large parallel resistance (generally provided by a low leakage dielectric) of at least $10^4$ Ohms, preferably $\geq 10^5$ Ohms, most preferably >$10^6$ Ohms. Effective high Q provides low field and/or high read range operation in MHz range frequencies and higher. Recrystallization may comprise irradiating with a laser sufficiently to recrystallize the semiconductor, heating at a temperature and time below the damage threshold of the metal sheet/film 10 but sufficient to recrystallize the semiconductor, and/or inducing or promoting semiconductor crystallization using a metal (e.g., Ni, Au, etc.) at a temperature generally lower than the semiconductor recrystallization temperature (e.g., 400° C. or less, 300° C. or less, or 250° C. or less).

Figure 5A:
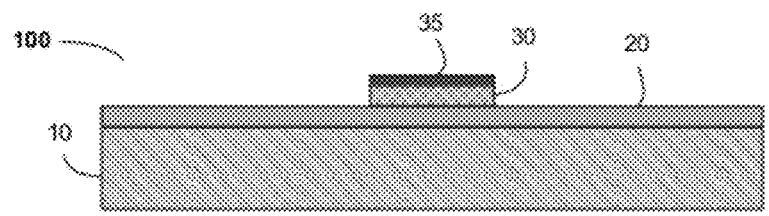
FIGS. 5A and 5B show cross-sectional and top views, respectively, of the substrate of FIGS. 4A-4B with a second semiconductor component layer on the first semiconductor component layer.
Figure 5B:
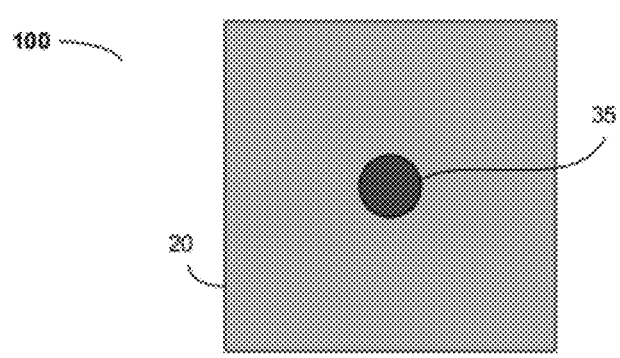
Figure 7A:
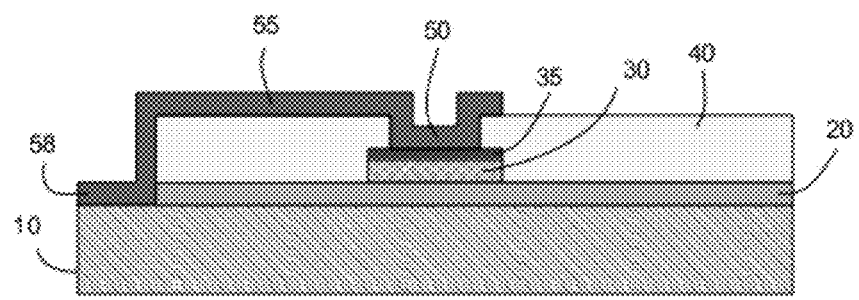
FIGS. 7A and 7B show cross-sectional and top views, respectively, of the substrate of FIGS. 6A-6B with a conductive structure thereon.
Figure 7B:
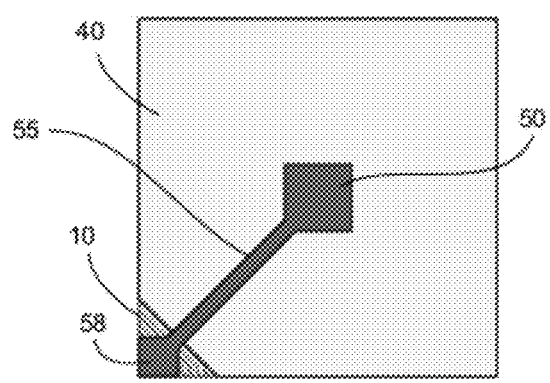

Heavily doping, or alternatively, siliciding the semiconductor material may also increase the frequency response of the EAS tag MOS capacitor circuit, and form a low resistance/barrier contact between the semiconductor component 30 and an electrode (e.g., upper capacitor plate 50 and conductor 55, shown in FIGS. 7A-7B). A doped semiconductor layer 30 may be formed by conventionally implanting a conventional semiconductor dopant, diffusing such a dopant into the semiconductor material from a solid or vapor dopant source, by printing a doped semiconductor or semiconductor precursor such as a B- or P-containing (cyclo)silane (see copending U.S. application Ser. Nos. 10/616,147 and 10/789,317, respectively filed Jul. 8, 2003 and Feb. 27, 2004, the relevant portions of each of which are incorporated herein by reference), and/or by laser forward transfer of a doped semiconductor layer or dopant diffusion source layer. Referring now to FIGS. 5A-5B (which respectively show cross-sectional and top-down views of EAS device 100), a metal silicide layer 35 may be formed on semiconductor component 30 by, e.g., blanket depositing a metal film, annealing to form the metal silicide, and removing the non-silicided metal by selective etching. Suitable metal silicides include titanium silicide, tungsten silicide, cobalt silicide, molybdenum silicide, and others.

Heavily doped or silicided contacts between upper capacitor plate 50 and semiconductor layer 30 may also allow for improved ohmic contact and/or reduced contact resistance. The carrier concentration of the doped contact layer is preferably >$10^{18}$ $cm^{-3}$. This reduces the overall series resistance of the EAS device and results in higher Q and large relative capacitance changes for the MOS capacitor in the EAS device, as more voltage may be present across the active semiconductor region of the device. Thus, and now referring to FIGS. 5A-5B, the present manufacturing method may further comprise printing a contact layer 35 onto the active silicon semiconductor layer 30 using, e.g., a silicon-containing ink further containing one or more dopants. This process step has the advantage of not requiring a high temperature diffusion and/or activation step. The dopant may be active upon curing the silicon precursor ink, or it may be activated by conventional thermal, optical, or laser annealing, including activation during a combined dopant activation and recrystallization step.

It may also be desirable to provide a relatively low level of doping (a concentration of $<5 \times 10^{18}$ cm$^{-3}$ electrically active dopant atoms) in the bulk of the active semiconductor layer 30 to control the CV slope of the device and also reduce the series resistance of the semiconductor component, thereby allowing higher Q and/or higher frequency operation. Simple RC calculations of the EAS device performance indicate that conductivities of the semiconductor component film 30 may need to be higher than $\sim 2.5 \times 10^{-2} \Omega^{-1}$ cm$^{-1}$ for device operation at a frequency of about 13.56 MHz. This may be achieved with (1) mobilities near 10 cm$^2$/vs and above and (2) electrically active doping levels of $\sim 10^{17}$ cm$^{-3}$. (These calculations do not account for contact resistance and/or contact barriers, and actual conductivity requirements may be higher. For example, assuming a 0.5Ω contact resistance, the conductivity requirements would increase to approximately $4.5 \times 10^{-2}$ $\Omega^{-1}$ cm$^{-1}$, and the doping level would increase correspondingly.)

In addition, the semiconductor component may comprise a multilayer structure 30/35. For example, and continuing to refer to FIGS. 5A-5B, successive silane coating/curing processes may be used to form an n− doped silicon film 30 and an n+ doped silicon film 35 thereon, an n-doped silicon film 30 and a p-doped silicon film 35 thereon or vice versa (each of which may comprise multiple layers of differing dopant concentrations, or which may have an intrinsic semiconductor layer between them) to form a conventional p-n, p-i-n or Schottky diode (in which case silicon film 35 may only partially overlie silicon film 30, and silicon film 30 may be in electrical communication with a second conductor and/or a second interconnect pad in electrical communication with conductor 55 or logic circuitry [not shown]), or more complex alternating n-doped and p-doped silicon films, etc.

Forming the Interlayer Dielectric

Figure 6A:
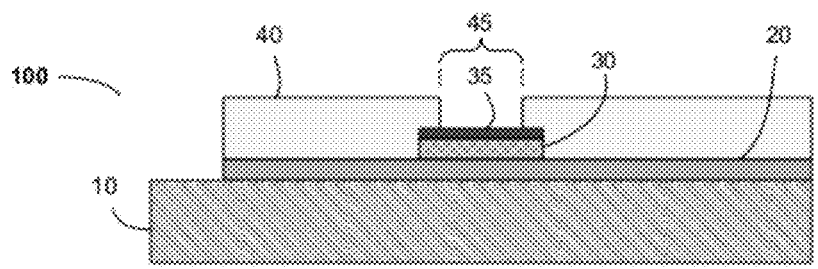
FIGS. 6A and 6B show cross-sectional and top views, respectively, of the substrate of FIGS. 5A-5B with an interlayer dielectric thereon.
Figure 6B:
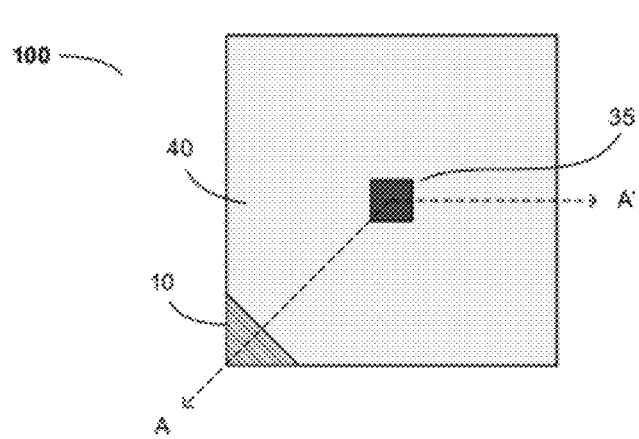

Referring now to FIGS. 6A-6B (which respectively show cross-sectional and top-down views of EAS device 100), the present method of manufacturing a surveillance and/or identification device may further comprise the step of depositing an interlayer dielectric (ILD) 40 on at least a part of the dielectric film 20. The ILD provides an electrical separation, in terms of leakage and capacitance, between the inductor 10b-10i and the top electrode strap 55 (see, e.g., FIG. 1), which may be highly desired and/or necessary for EAS tag operation.

In one embodiment, the step of depositing the interlayer dielectric 40 is performed after the step of forming the semiconductor component 30, and in an alternative embodiment (see FIGS. 10A-11B and the corresponding discussion thereof below), the step of depositing the interlayer dielectric 40 is performed before the step of forming the semiconductor component 30. In either case, the interlayer dielectric 40 may be blanket deposited over the entire device and selected portions thereof removed (e.g., by conventional photolithography and etching), or alternatively, interlayer dielectric 40 may be selectively deposited on one or more predetermined portions of dielectric film 20 (and, optionally, on one or more predetermined portions of semiconductor component 30 or upper semiconductor component layer 35) by, e.g., printing an interlayer dielectric precursor thereon. Also, in either case, the interlayer dielectric may have a thickness of at least one micron, preferably from 2 to 20 μm, more preferably from 5 to 10 μm.

In the case where the step of depositing the interlayer dielectric 40 is performed after the step of forming the semiconductor component 30, the interlayer dielectric 40 is also deposited on at least a part of the semiconductor component 30. In the case where the interlayer dielectric 40 is blanket deposited, the method generally further comprises the step of forming a via 45 in the interlayer dielectric 40 sufficient to expose at least part of the semiconductor component 30 or upper semiconductor component layer 35. The ILD via 45 also defines or partially defines the size of the MOS capacitor, as the areas outside of the via 45 covered by the upper capacitor plate 55 (see, e.g., FIG. 1) would be areas where the capacitance per unit area is very low, because of (i) the greater thickness of the ILD 40 compared to the dielectric film 20, and/or (ii) in preferred embodiments, a lower dielectric constant for the ILD 40 relative to the dielectric film 20 (a dielectric constant of 2-3 for a silicon dioxide ILD 40, as compared to 8.4 for aluminum oxide).

Thus, in some implementations, the step of depositing the interlayer dielectric 40 may comprise the steps of (i) printing a liquid-phase interlayer dielectric precursor ink on at least predetermined portions of the dielectric film 20, and (ii) drying and/or curing the interlayer dielectric precursor/ink to form the interlayer dielectric 40. The liquid-phase interlayer dielectric precursor ink may be printed on the dielectric film such that an opening 45 is formed into which the semiconductor component (preferably a Group IVA element or Group IVA element precursor) is subsequently deposited. Similar to the method for forming semiconductor component 30, the liquid-phase interlayer dielectric precursor ink may comprise a compound of the formula $A_nH_y$, where n is from 3 to 12, each A is independently Si or Ge, and y is an even integer of from n to 2n+2, and preferably a compound of the formula $(AH_z)_n$, where n is from 5 to 10, each A is independently Si or Ge, and each of the n instances of z is independently 1 or 2. In the case of the ILD 40, the corresponding silicon and/or germanium oxide film is formed by curing the Group IVA element precursor film in an oxidizing atmosphere (e.g., at a temperature of 300° C., 350° C. or 400° C. or more, but less than the melting temperature of the substrate 10, in the presence of oxygen, ozone, $N_2O$, $NO_2$, or other oxidizing gas, which may be diluted in an inert carrier gas such as nitrogen, argon or helium). Of course, the silane-based Si or $SiO_2$ precursor film (see, e.g., U.S. application Ser. Nos. 10/789, 317 and 10/789,274, each filed on Feb. 27, 2004 and incorporated herein by reference) may also be blanket deposited and photolithographically etched.

Other solution-based dielectrics, including spin on glasses, organic dielectrics, etc., may be applied by printing or other conventional coating steps. Suitable ILD materials include spin on glasses (which may be photodefinable or non-photodefinable, in the latter case patterned by direct printing or post deposition lithography); polyimides (which may be photodefinable and/or thermally sensitized for thermal laser patterning, or non-photodefinable for patterning by direct printing or post deposition lithography); BCB or other organic dielectrics such as SiLK® dielectric material (SILK is a registered trademark of Dow Chemical Co., Midland, Mich.); low-k interlayer dielectrics formed by sol-gel techniques; plasma enhanced (PE) TEOS (i.e., $SiO_2$ formed by plasma-enhanced CVD of tetraethylorthosilicate); and laminated polymer films such as polyethylene (PE), polyester, or higher temperature polymers such as PES, polyimide or others that are compatible with subsequent high temperature processing.

An additional "via" or opening in ILD 40 is generally required to allow contact between the "pad" end 10*j* of the inductor coil 10*b*-10*i* and the interconnect pad 58 of the top electrode 55 (see, e.g., FIGS. 9A-9B). The ILD 40 may be printed in a pattern providing for such contact, or the additional opening may be formed in a later etch step, which may be performed by laser ablation, mechanical penetration or other etching or dielectric removal technique. Thus, after ILD 40 is printed, defined and/or patterned, dielectric film 20 is similarly patterned (typically by conventional wet or dry etching), using ILD 40 (and semiconductor component 30/35) as a mask, resulting in the structure shown in FIGS. 6A-6B. For convenience in showing the interconnect structure at the lower left-hand corner of tag 100, FIG. 6A is a cross-sectional view of the tag 100 of FIG. 6B with the left-hand side showing the cross-section along the diagonal axis from the center of tag 100 to point A, and the right-hand side showing the cross-section along the axis from the center of tag 100 to point A'.

The process flow of FIGS. 3A-6B, with formation of ILD 40 following the deposition of semiconductor component 30, has some advantages, including the fact that silicon processing in semiconductor component formation, which may include high temperatures, UV irradiation and/or laser exposure, does not necessarily and/or directly affect the ILD 40, as the ILD 40 can be added after semiconductor component formation. The critical planar dimensions may be controlled by the conductor deposition process, the extent of a heavily doped contact layer that can define the effective area of the MOS capacitor, or by local recrystallization (where the lateral extent of the laser exposed regions controls the effective area, and therefore, the nominal capacitance of the device by limiting the active recrystallized and/or dopant activated region of the device). Also, as mentioned above, by using a via 45 smaller than the printed semiconductor component dimensions and thus positioning the active area of the MOS capacitor away from potentially detrimental edge regions, the impact of potentially detrimental edge effects can be reduced. It may also be possible to use a high precision printing technique, such as ink jet printing, syringe dispensing, stenciling, screen printing, aerosol jet printing, etc., to define the capacitor size by printing a top capacitor plate where the overall capacitance is partially or fully defined by the line width and/or resolution of the printed conductor feature (in this case, capacitor plate 50).

Blanket deposition of the ILD 40 may be done by extrusion, blade, dip, linear, spin or other coating technique, as well as by local deposition techniques such as printing or dispensing. In the case of printing or dispensing, this may also serve the purpose of patterning the ILD 40. Patterning of the ILD layer 40 may be done by direct printing of the ILD precursor materials (e.g., by IJP, screen, gravure, flexography, laser forward transfer, etc.) or indirect patterning (such as with a photo- and/or thermo-patternable precursor material that is exposed by a photomask, thermal or laser pattern and developed, or extrinsically via a patterning process such as conventional photolithography, embossing or similar technique).

Figure 10A:
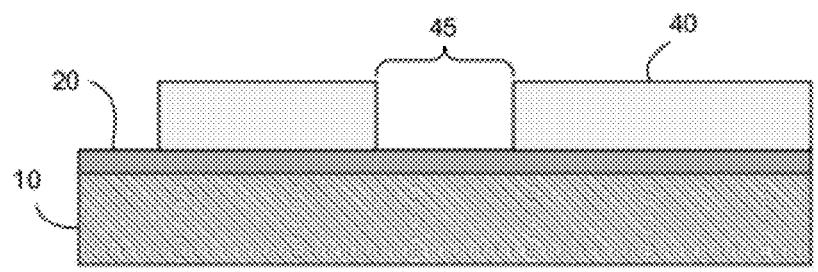
FIGS. 10A and 10B show cross-sectional and top views, respectively, of an alternative embodiment of the present invention in which the substrate of FIGS. 3A-3B has an interlayer dielectric thereon.
Figure 10B:
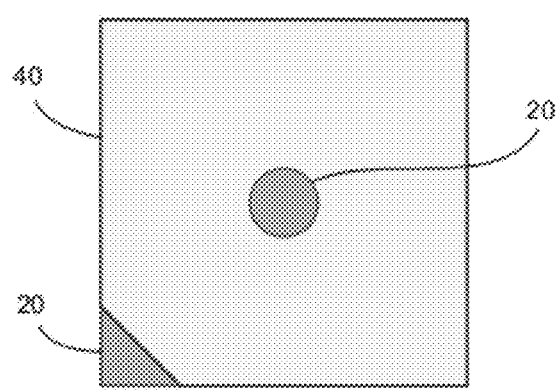

Referring now to FIGS. 10A-10B, in another version of the manufacturing process, formation of the ILD 40 and via 45 may precede the deposition of the semiconductor component 30 and/or its associated contact/doping/silicide layer(s) 35. This alternative process has the advantage that the surface energy and/or physical pattern of the ILD 40 may direct or pattern the features of a printed semiconductor component 30, thereby controlling the physical dimensions of the non-linear device.

In this case, the physical steps and/or wetting properties of the ILD 40 versus the exposed area of the dielectric film 20 within via 45 may serve to pattern or otherwise control the extent to which the semiconductor component precursor solution is deposited or printed, thereby helping to control the tolerances of the circuitry on the EAS device 100. This can be particularly advantageous in non-swept EAS read systems, where the reader interrogation/power signal is fixed. In this case, the transponder's resonance must closely match that of the reader signal in order for good coupling to occur between the transponder and reader. Controlling the effective capacitor size through the patterning of the ILD 40 provides a means or mechanism for limiting the spread of the resonances of the tags (i.e., the tag-to-tag or lot-to-lot resonance frequency variation) due to manufacturing variations.

In this alternative process, the ILD 40 can define the effective size of the semiconductor component 30 (and, optionally, upper semiconductor component layer 35) and/or capacitor 55, and therefore control the tolerances for the capacitor size. This may have advantages where the processes for making or forming the nonlinear capacitor elements may be of relatively low placement or alignment accuracy (high speed printing, for instance). The ILD 40 is of sufficient thickness that the overlap capacitance formed between the top conductors 50/55 (including the capacitor plates and the strap) and the bottom conductors (including the bottom electrode plate 10*a*, inductor 10*b*-10*i*, and interconnect pad 10*j*) is not significant in comparison with the capacitance of the region contained within the ILD via 45.

However, in the version of the manufacturing process shown in FIGS. 4A-6B, the ILD 40 and ILD via 45 are formed after depositing the semiconductor component 30/35. Again, in this case, the extent of the high capacitance MOS active region is effectively defined by the size of via 45, and not the area of the printed semiconductor component 30/35. It may be advantageous for the via size to be significantly smaller than the semiconductor component size to reduce the impact of edge nonuniformities that may be present (e.g., edge drying effects, roughness, or chemical inhomogeneity that may occur at the edge of printed, solution-deposited, or etched semiconductor features).

Forming the Conductor

Referring now to FIGS. 7A-7B, the present method of manufacturing a surveillance and/or identification device generally comprises forming a conductive structure 50, generally configured to provide electrical communication between the semiconductor component 30/35 and substrate 10 (from which, as will be seen in FIGS. 9A-9B and discussed below, the EAS circuit inductor and bottom capacitor plate can be subsequently formed). In one implementation, the step of forming the conductor 50 comprises printing a conductor ink onto the semiconductor component 30/35 and at least part of the interlayer dielectric 40 (and optionally, onto at least part of the substrate 10). As for the semiconductor component-forming step(s), the step of forming the conductor may further comprises the step(s) of drying and/or curing the conductor ink. Alternatively, the step of forming the conductor comprises depositing the conductor onto semiconductor component 30/35, the interlayer dielectric, and exposed portion(s) of the substrate 10, and etching the conductor to form conductive structure 55 and upper capacitor plate 50. Thus, the method generally comprises the step(s) of (1) forming the conductive structure 50/55 such that it is in electrical communication with at least one of (and preferably both of) the semiconductor component 30/35 and the substrate 10, and/or (2) forming the conductive structure 50/55 after the semiconductor component 30.

In preferred implementations, the top electrode (e.g., conductor 55) further includes an interconnect pad 58 from the outside of the to-be-formed inductor coil 10b-10h (see, e.g., FIG. 1) and an upper, charge-injecting plate or electrode 50 of the MOS capacitor. Similar to the semiconductor element 30, the top electrode may be formed by printing (e.g., by inkjet printing, screen printing, syringe dispensing, micro-spotting, gravure printing, offset printing, flexographic printing or other printing method) one or more conducting inks or conducting ink precursors onto the upper surface of the structure of FIGS. 6A-6B in the pattern shown in FIG. 7B.

Inclusion of dopants, siliciding components, or other agents (work function modulation agents and/or tunneling barrier materials) into conductive structure 50 may reduce the series resistance and increase the Q and overall tag performance. Such series resistance reduction may comprise (i) one or more additives in the top electrode ink and/or (ii) depositing one or more interlayer material(s) between the top electrode and the underlying semiconductor component 30/35.

Passivation

Figure 8:
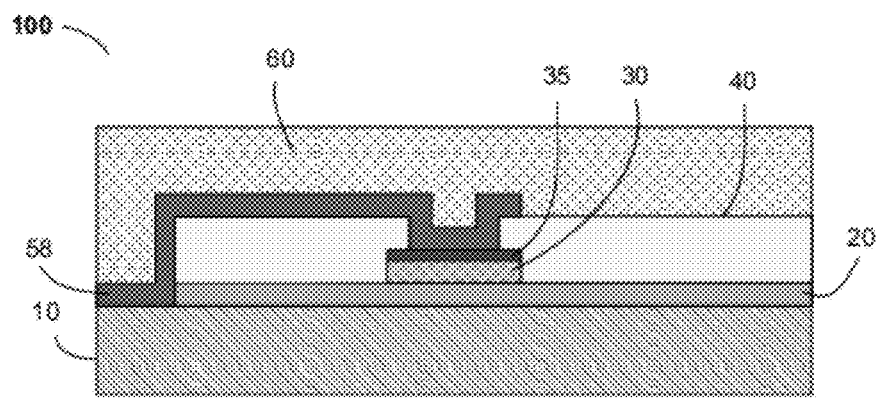
FIG. 8 shows a cross-sectional view of the substrate of FIGS. 7A-7B with a passivation layer thereon.

As shown in FIG. 8, after forming conductive structure 50, the present manufacturing method may further comprise the step of passivating (e.g., forming a passivation layer 60) over the interlayer dielectric 40 and the conductive structure 50 (and, when exposed, substrate 10). A passivation layer 60 generally adds mechanical support to the EAS device, particularly during the substrate etching process, and may prevent the ingress of water, oxygen, and/or other species that could cause the degradation or frequency drifting of device performance. The passivation layer 60 may be formed by conventionally coating the upper surface of the device 100 with one or more inorganic barrier layers such as a polysiloxane and/or a nitride, oxide and/or oxynitride of silicon and/or aluminum, and/or one or more organic barrier layers such as parylene, a fluorinated organic polymer (e.g., as described above), or other barrier material.

Forming the Inductor and/or Lower Capacitor Plate

FIGS. 9A-9B respectively show cross-sectional and bottom views of EAS device 100, in which substrate 10 has been patterned and etched to form lower capacitor plate 10a, inductor 10b-10i and interconnect area 10j. Thus, the present manufacturing method further comprising the step of etching the electrically functional substrate, preferably wherein the etching forms an inductor and/or a capacitor plate (i) capacitively coupled to semiconductor component 30 under one or more predetermined conditions (such as above the predetermined threshold voltage described above) and/or (ii) complementary to the upper capacitor plate 50 formed as part of the conductive structure 55.

The substrate 10 (see FIG. 8) can be patterned by conventional photolithography, or by contact printing or laser patterning of a resist material applied to the backside (non-device side) of substrate 10. The substrate 10 can then be etched with standard wet (e.g., aqueous acid) or dry (e.g., chlorine, boron trichloride) etches to form the capacitor plate 10a, inductor 10b-10i and interconnect pad 10j. The patterning and/or etching steps may be thermally, optically or electrically assisted. The substrate 10 may also be patterned by direct means such as milling, laser cutting, stamping, or die-cutting.

A backing and/or support layer may be desired or required to provide mechanical stability and/or protection for the non-passivated side of the device 100 during later handling and/or processing. Thus, the present manufacturing method may further comprise the step of adding a support or backing to the etched electrically functional substrate. This backing layer may be added by lamination to paper or a flexible polymeric material (e.g., polyethylene, polypropylene, polyvinyl chloride, polytetrafluoroethylene, a polycarbonate, an electrically insulating polyimide, polystyrene, copolymers thereof, etc.) with the use of heat and/or an adhesive. Where the backing comprises an organic polymer, it is also possible to apply the backing layer from a liquid precursor by dip coating, extrusion coating or other thick film coating technology.

An Exemplary Method of Tracking Articles Using the Present EAS and/or RF Tags/Devices The present invention further relates to method of detecting an item or object in a detection zone comprising the steps of: (a) causing or inducing a current in the present device sufficient for the device to backscatter detectable electromagnetic radiation (preferably at a frequency that is an integer multiple or an integer divisor of an applied electromagnetic field), (b) detecting the detectable electromagnetic radiation, and optionally, (c) selectively deactivating the device. Generally, currents and voltages are induced in the present device sufficient for the device to backscatter detectable electromagnetic radiation when the device is in a detection zone comprising an oscillating electromagnetic field. This oscillating electromagnetic field is produced or generated by conventional EAS and/or RFID equipment and/or systems. The present method of use may further comprise attaching, affixing or otherwise including the present device on or in an object or article to be detected. Furthermore, in accordance with an advantage of the present device, it may be deactivated by non-volatile shifting of the thresholds (ie position of the CV curve features versus voltage) or capacitance of the device in response to an applied electromagnetic field having sufficient strength and an effective oscillating frequency to induce a current, voltage and/or resonance in the device. Typically, the device is deactivated when the presence of the object or article in the detection zone is not to be detected or otherwise known.

The use of electronic article surveillance or security systems for detecting and preventing theft or unauthorized removal of articles or goods from retail establishments and/or other facilities, such as libraries, has become widespread. In general, EAS systems employ a label or security tag, also known as an EAS tag, which is affixed to, associated with, or otherwise secured to an article or item to be protected or its packaging. Security tags may have many different sizes, shapes and forms, depending on the particular type of security system in use, the type and size of the article, etc. In general, such security systems are employed for detecting the presence or absence of an active security tag as the security tag and the protected article to which it is affixed pass through a security or surveillance zone or pass by or near a security checkpoint or surveillance station.

The present tags are designed at least in part to work with electronic security systems that sense disturbances in radio frequency (RF) electromagnetic fields. Such electronic security systems generally establish an electromagnetic field in a controlled area defined by portals through which articles must pass in leaving the controlled premises (e.g., a retail store). A tag having a resonant circuit is attached to each article, and the presence of the tag circuit in the controlled area is sensed by a receiving system to denote the unauthorized removal of an article. The tag circuit may deactivated, detuned or removed by authorized personnel from any article authorized to leave the premises to permit passage of the article through the controlled area equipped with alarm activation. Most of the tags that operate on this principle are single-use or disposable tags, and are therefore designed to be produced at low cost in very large volumes.

The present tags may be used (and, if desired and/or applicable, re-used) in any commercial EAS and/or RFID application and in essentially any frequency range for such applications. For example, the present tags may be used at the frequencies, and in the fields and/or ranges, described in the Table below:

TABLE 1

Exemplary applications.

| Frequencies | Preferred Frequencies | Range/Field of Detection/ Response | Preferred Range/Field of Detection/ Response | Exemplary Commercial Application(s) |
|---|---|---|---|---|
| 100-150 KHz | 125-134 KHz | up to 10 feet | up to 5 feet | animal ID, car anti-theft systems, beer keg tracking |
| about 13.56 MHz | 13.56 MHz | up to 10 feet | up to 5 feet | inventory tracking (e.g., libraries, apparel, auto/motorcycle parts), building security/access |
| 800-1000 MHz | 868-928 MHz | up to 30 feet | up to 18 feet | pallet and shipping container tracking, shipyard container tracking |
| 2.4-2.5 GHz | about 2.45 GHz | up to 30 feet | up to 20 feet | auto toll tags |

Deactivation methods generally incorporate remote electronic deactivation of a resonant tag circuit such that the deactivated tag can remain on an article properly leaving the premises. Examples of such deactivation systems are described in U.S. Pat. Nos. 4,728,938 and 5,081,445, the relevant portions of each of which are incorporated herein by reference. Electronic deactivation of a resonant security tag involves changing or destroying the detection frequency resonance so that the security tag is no longer detected as an active security tag by the security system. There are many methods available for achieving electronic deactivation. In general, however, the known methods involve either short circuiting a portion of the resonant circuit or creating an open circuit within some portion of the resonant circuit to either spoil the Q of the circuit or shift the resonant frequency out of the frequency range of the detection system, or both.

At energy levels that are typically higher than the detecting signal, but generally within FCC regulations, the deactivation apparatus induces a voltage in the resonant circuit of the tag 100 sufficient to cause the dielectric film 20 between the lower capacitor plate 10a and semiconductor component 30 to break down. Thus, the present EAS tag 100 can be conveniently deactivated at a checkout counter or other similar location by momentarily placing the tag above or near the deactivation apparatus.

The present invention thus also pertains to article surveillance techniques wherein electromagnetic waves are transmitted into an area of the premises being protected at a fundamental frequency (e.g., 13.56 MHz), and the unauthorized presence of articles in the area is sensed by reception and detection of electromagnetic radiation emitted by the present EAS device 100. This emitted electromagnetic radiation may comprise second harmonic or subsequent harmonic frequency waves reradiated from sensor-emitter elements, labels, or films comprising the present EAS device that have been attached to or embedded in the articles, under circumstances in which the labels or films have not been deactivated for authorized removal from the premises.

A method of article surveillance or theft detection according to one aspect of the present invention may be understood with the following description of the sequential steps utilized. The present EAS tag 100 (for example, formed integrally with a price label) is attached to or embedded in an item, article or object that may be under system surveillance. Next, any active EAS tags 100 on articles that have been paid for or otherwise authorized for removal from the surveillance area may be deactivated or desensitized by a deactivation apparatus operator (e.g., a checkout clerk or guard) monitoring the premises. Thereafter, harmonic frequency emissions or reradiation signals or electromagnetic waves or energy from tags 100 that have not been deactivated or desensitized are detected as they are moved through a detection zone (e.g., an exit or verification area) in which a fundamental frequency electromagnetic wave or electrical space energy field is present. The detection of harmonic signals in this area signifies the unauthorized presence or attempted removal of unverified articles with active tags 100 thereon, and may be used to signal or trigger an alarm or to lock exit doors or turnstiles. While the detection of tag signals at a frequency of 2× or ½ the carrier or reader transmit frequency represents a preferred form of the method of use, other harmonic signals, such as third and subsequent harmonic signals, as well as fundamental and other subharmonic signals, may be employed.

Exemplary Process Flow

The following table contains a simplified example of a process flow for manufacturing a MOS capacitor tag using the inductor/bottom capacitor plate as the substrate. There are numerous other variants of this flow.

TABLE 2

Exemplary process flow.

| Module | Step | Process | Comment |
|---|---|---|---|
| Substrate | Substrate | <100 um Al sheet | 25-100 μm Al foil/sheet |
| Dielectric | form $Al_2O_3$ | anodize Al -> $Al_2O_3$ | 100-200 Å oxide |
|  | Pattern $Al_2O_3$ | low resolution resist | May be used to define a 100 μm (or greater) strap to inductor contact area |

TABLE 2-continued

Exemplary process flow.

| Module | Step | Process | Comment |
|---|---|---|---|
| Si | Silane print/polymerize | inkjet print + UV irradiation, slot coat + UV irradiation | |
| | Silane - Si conversion | Laser, flash oven anneal, RTA, | Typical anneal at 400-450 C. for 20 min in inert atmosphere |
| | Recrystallization and/or Dopant activation | Laser or flash lamp anneal | Pulsed excimer laser recrystallization and dopant activation is preferred for liquid silane-derived Si. |
| | Doped contact layer | Deposition or diffusion from solid or vapor source | Rc < 10 Ohm, < 1 Ohm preferably |
| | Recrystalization and/or Dopant activation | Laser or flash lamp anneal | Pulsed excimer laser recrystallization and dopant activation has been demonstrated for liquid-silane derived Si. |
| ILD | planarize/ILD | polyimide/ photopolymer/ SOG coat | About 1-10 μm thickness preferred to minimize top electrode/strap overlap parasitic capacitance |
| | Pattern ILD | Laser pattern, photo pattern | Pattern feature size ~100-1000 μm |
| Top Electrode/ Strap | Deposit top electrode metal | Sputter, IJP, screen, stencil, gravure, flexographic, aerosol, etc. | |
| | Pattern top metal | contact/laser pattern resist | 5-20 μm, depending on strap line width and metal conductivity. |
| | Etch top metal | web bath etch | If required; may be useful to laminate or coat the substrate bottom surface to prevent undesired etching |
| Passivate/ laminate | Top surface passivation; laminate to support/ provide protective backing | laminate/extrude/ spray | Etch resistance during inductor coil etch, may provide mechanical stability |
| Inductor | Inductor pattern | web contact print, laser resist | contact printer, Creo, AGFA, DNS, etc. |
| | Inductor Etch | web bath etch | |

Models of Reproducible Breakdown Voltage and Nonlinear Behavior

Example 1

Figure 12:
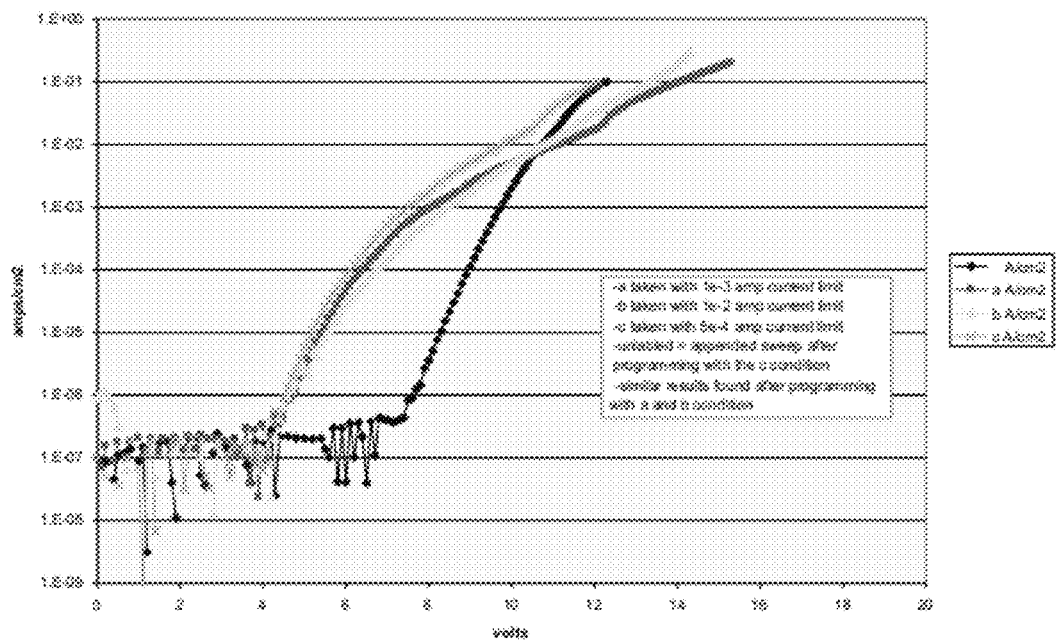
FIGS. 12-13 are graphs depicting the breakdown voltage of exemplary dielectric films in exemplary models of the present invention.

4N Aluminum sheets (Al 1199; nominally 20-100 μm thick, having a resistivity of about $3 \times 10^{-6}$ ohm-cm) were anodized in 0.1 wt % aqueous citric acid solution at pH=5 (adjusted using a 10% KOH solution). Anodization (at currents of from 0.5 mA/cm² to 1 mA/cm², $V_{final}$=20 V) was used to form controlled thicknesses of low leakage $Al_2O_3$ dielectric films with controlled breakdown voltages on the Al sheet, thereby providing a suitable model for MOS dielectric film 20 and a deactivation mechanism for tag 100. The I(V) curves shown in FIG. 12 were taken from the anodized Al sheets, where the ordinate represents the measured leakage current across the dielectric film at a given voltage (displayed on the abscissa). The anodized films show (1) low leakage at voltages typical of active EAS operations and (2) breakdown voltages between 10 and 20V (as determined by the endpoints of the I-V curves; at greater voltages, current through the dielectric films increased by orders of magnitude, taking the values significantly off scale).

Example 2

An aluminum sheet (Al 1199 coupon; essentially the same as in Example 1) was cleaned in 5 vol % aqueous phosphoric acid at 80-85° C. for 2 min, then anodized in 0.1 wt % aqueous citric acid at pH=5 (adjusted using dilute aqueous ammonia) as in Example 1, at a maximum current of 1 mA/cm² and a $V_{final}$=20 V, to form a low leakage $Al_2O_3$ dielectric film with a controlled breakdown voltage as a model for MOS dielectric film 20 and a deactivation mechanism for tag 100. The I(V) curve shown in FIG. 13 was taken from the anodized Al sheet, where the ordinate represents the measured leakage current across the dielectric film at a given voltage (which is displayed on the abscissa). The anodized film shows (1) low leakage at voltages typical of active EAS operations and (2) a controlled breakdown voltage at 16.9V.

Example 3

Separately, a model nonlinear MOS capacitor was made. Al (300 nm) was sputtered on a quartz wafer (4" diameter, 0.5 mm thickness). The aluminum film was anodized in 0.1 wt % aqueous citric acid solution at pH=5 (adjusted using a 10% KOH solution), using a maximum anodization voltage of 20V and a maximum current=0.25 mA/cm². Silicon films (about 100 nm thick) were formed directly on the anodized Al film from a liquid silane precursor ink (generally, an approximately 20 vol % solution of a silane mixture comprising >90% cyclopentasilane in cyclooctane) by UV-spincoating the silane ink onto the anodized film in 2 steps (5 sec at 500 rpm and 30 sec at 2000 rpm, under a UV lamp that was turned on 2 sec after initiating spin-coating and left on for 32 sec at ~2 mW/cm² dosage; see, e.g., U.S. application Ser. No. 10/789,274, the relevant portions of which are incorporated herein by reference), then curing the silane film. The conditions for curing the silane film included soft-curing at 100° C.

for 10 min, then heating to a temperature of ~400° C. for 20 min under an argon atmosphere, resulting in a relatively crack-free silicon film. The final structure included in the model nonlinear MOS capacitor was a top Al electrode 0.3 μm thick (which was conventionally deposited onto the cured silane film and conventionally defined, but then subjected to a contact annealing step; see, e.g., U.S. application Ser. No. 10/789,274).

Figure 14:
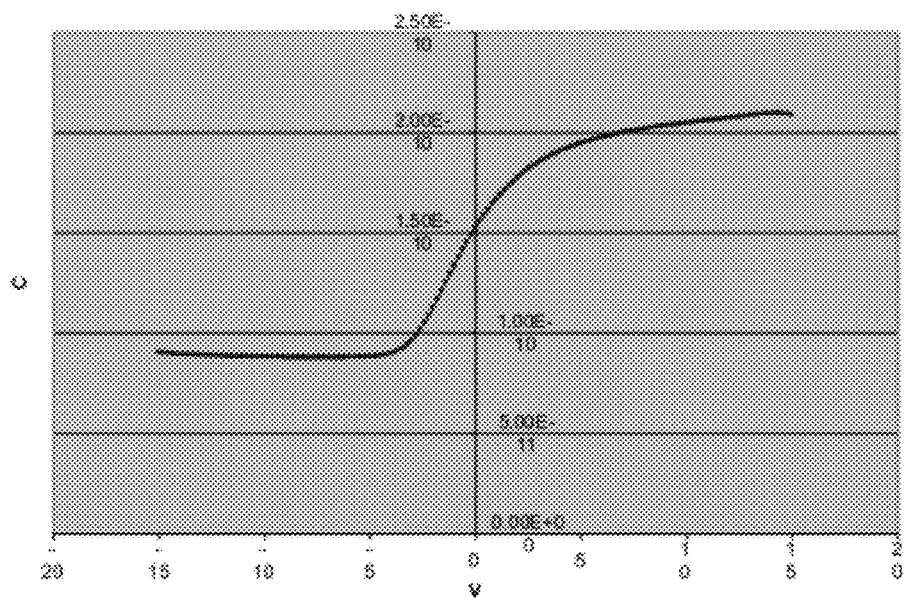
FIGS. 14-15 are graphs depicting nonlinear C-V curves for models of the present nonlinear MOS device.

The C-V curve of FIG. 14 demonstrates the feasibility of a number of the key elements for an EAS tag having a printed MOS capacitor (such as the model nonlinear MOS capacitor described in this example) which relies on non-linear behavior (C=f(V)) to generate a unique RF signature. It is generally advantageous to have a high C/V slope (dC/C·dV) and that the maximum C/V slope of the curve encompasses or has a center point or midpoint near or at 0V. While the C(V) curve of FIG. 13 satisfactorily demonstrates that both of these C(V) conditions are met in this model, the maximum C/V slope is about 20% and is centered between −1 and −2 V. Ideally, for commercial applications, the maximum C/V slope should be at least 50%, preferably at least 80%, and should be centered (i.e., have a center point or midpoint) between −1 and 1 V, preferably between −0.5 and 0.5 V.

Example 4

A second model nonlinear MOS capacitor was made. Al 1199 coupon (5 cm×5 cm) was laminated onto KAPTON tape. The sample was precleaned by sonication in isopropyl alcohol (IPA) for 15 min, then electropolished by the Brytal method for 10 min at 80° C. and 12V. The oxide on the exposed surface of the Al foil was stripped in dilute aqueous phosphoric acid at 80° C. for 2 min, then the exposed Al foil surface was anodized in a borate/glycol composition (0.1M ammonium pentaborate in ethylene glycol), using a maximum anodization voltage of 20V and a maximum current=1 mA/cm$^2$. Silicon films were formed on the anodized Al film as described in Example 3. The top electrode was formed from Ag paste (available commercially from PARALEC, located in Rocky Hill, N.J.) by curing at 300° C. for 10 minutes in air. The top Ag electrode had a surface area of about 1 mm$^2$ and a thickness of about 100-500 μm.

Figure 15:
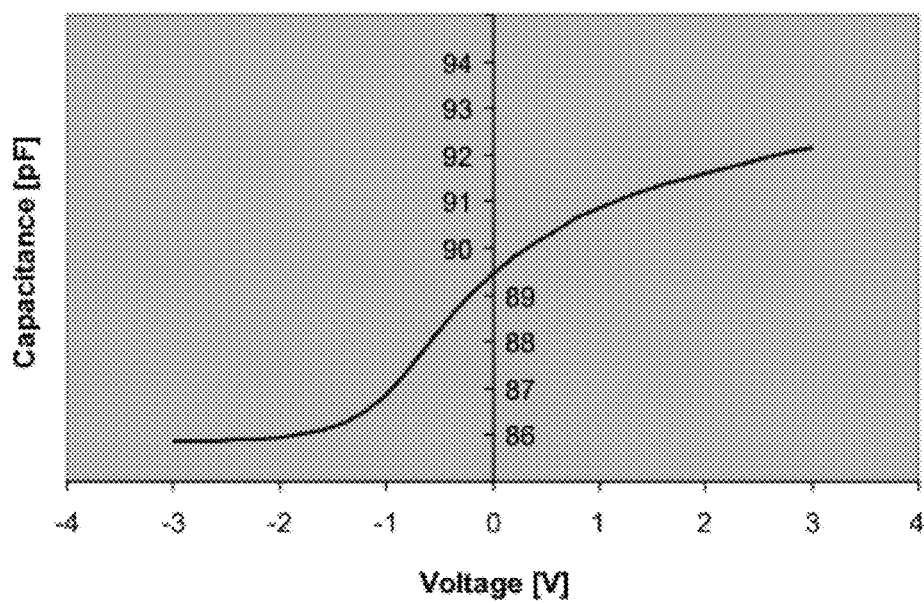

The C-V curve for the model nonlinear MOS capacitor of this example is shown in FIG. 15. This curve is nearly centered at 0V, and it shows a capacitance change for the exemplary MOS device of about 7% from −2V to +3V.

CONCLUSION/SUMMARY

Thus, the present invention provides a MOS surveillance and/or identification tag, and methods for its manufacture and use. The surveillance and/or identification device generally comprises (a) an inductor, (b) a first capacitor plate electrically connected to the inductor, (c) a dielectric film on the first capacitor plate, (d) a semiconductor component on the dielectric film, and (e) a conductor on the semiconductor component that provides electrical communication between the semiconductor component and the inductor. The method of manufacture generally comprises the steps of (1) depositing a semiconductor material or semiconductor material precursor on a dielectric film, the dielectric film being on an electrically functional substrate; (2) forming a semiconductor component from the semiconductor material or semiconductor material precursor; (3) forming a conductive structure configured to provide electrical communication between the semiconductor component and the electrically functional substrate; and (4) etching the electrically functional substrate to form (i) an inductor and/or (ii) a second capacitor plate capacitively coupled to the semiconductor component under one or more predetermined conditions. The method of use generally comprises the steps of (i) causing or inducing a current in the present device sufficient for the device to backscatter detectable electromagnetic radiation; (ii) detecting the detectable electromagnetic radiation; and optionally, (iii) selectively deactivating the device. The present invention advantageously provides a low cost EAS, RF and/or RFID tag capable of operating (A) in frequency division and/or frequency multiplication modes, and/or (B) at a relatively high standard radio frequency (e.g., 13.56 MHz).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of detecting items with a surveillance and/or identification device, comprising the steps of:
a) causing or inducing a current sufficient for the device to backscatter detectable electromagnetic radiation, the device comprising:
an inductor and/or a first capacitor plate,
a diode in electrical communication with the inductor and/or first capacitor plate, the diode comprising (i) a first semiconductor film having a first conductivity type and a first dopant concentration, and (ii) a second semiconductor film having a second conductivity type and a second dopant concentration, where at least one of the first conductivity type and first dopant concentration differs from the second conductivity type and second dopant concentration, respectively,
a first conductor electrically connected to the diode, providing electrical communication between the diode and at least one of the inductor and/or logic circuitry, and
an insulating layer between the inductor and/or the first capacitor plate and the first conductor;
b) detecting the detectable electromagnetic radiation; and
c) optionally, selectively deactivating the device.

2. The method of claim 1, wherein the surveillance and/or identification device comprises an electronic article surveillance (EAS) device, a radio frequency (RF) device, or a radio frequency identification (RFID) device.

3. The method of claim 1, comprising operating the device at a frequency of 13.56 MHz.

4. The method of claim 1, comprising operating the device at a frequency of from 100 to 400 KHz.

5. The method of claim 1, comprising operating the device at a frequency of from 800 to 1000 KHz.

6. The method of claim 1, comprising operating the device at a frequency of from 2.4 to 2.5 GHz.

7. The method of claim 1, wherein the semiconductor component has a conductivity of at least $2\times10^{-2}$ S/cm or a carrier mobility of at least 10 cm$^2$/vs.

8. The method of claim 1, wherein the detectable electromagnetic radiation has a frequency that is an integer divisor or an integer multiple of a fundamental frequency.

9. The method of claim 8, further comprising applying an oscillating electromagnetic field or wave having the fundamental frequency to the device.

10. The method of claim 8, wherein the detectable electromagnetic radiation comprises second harmonic or subsequent harmonic frequency waves backscattered from a sensor-emitter element, label, or film comprising the device.

11. The method of claim 1, wherein causing or inducing the current comprises generating an oscillating electromagnetic field or wave in a detection zone, the oscillating electromagnetic field or wave having a fundamental frequency, and allowing the device to be brought into the detection zone.

12. The method of claim 1, wherein the device is nonlinearly polarized in response to an applied electromagnetic field having sufficient strength and an effective oscillation frequency to induce the current in the device.

13. The method of claim 1, further comprising attaching, affixing, or including the device on or in the item.

14. The method of claim 1, comprising deactivating the device by applying a radio frequency electromagnetic field to the device sufficient to induce a voltage differential of from 4 to 50 V in a capacitor in the device.

15. A method of detecting items with a surveillance and/or identification device, comprising the steps of:
a) causing or inducing a current sufficient for the device to backscatter detectable electromagnetic radiation, the device comprising:
a first capacitor plate,
an inductor electrically connected to the first capacitor plate,
a dielectric film on the first capacitor plate,
a semiconductor component on the dielectric film, the semiconductor component being capacitively coupled to the first capacitor plate, wherein the semiconductor component comprises a first layer consisting essentially of silicon and a second layer of metal silicide on the first layer, and
a conductor electrically connected to the semiconductor component, providing electrical communication between the semiconductor component and the inductor;
b) detecting the detectable electromagnetic radiation; and
c) optionally, selectively deactivating the device.

16. The method of claim 15, wherein the surveillance and/or identification device comprises an electronic article surveillance (EAS) device, a radio frequency (RF) device, or a radio frequency identification (RFID) device.

17. The method of claim 15, wherein the device is a RF device or a RFID device, and the method comprises operating the device at a frequency of 13.56 MHz.

18. The method of claim 15, wherein the device is an EAS device, and the method comprises operating the device at a frequency of from 100 to 400 KHz.

19. The method of claim 15, wherein the device is an EAS device, and the method comprises operating the device at a frequency of from 800 to 1000 KHz.

20. The method of claim 15, wherein the device is a RF device or a RFID device, and the method comprises operating the device at a frequency of from 2.4 to 2.5 GHz.

21. The method of claim 15, wherein the detectable electromagnetic radiation has a frequency that is an integer divisor or an integer multiple of a fundamental frequency.

22. The method of claim 21, further comprising applying an oscillating electromagnetic field or wave having the fundamental frequency to the device.

23. The method of claim 21, wherein the detectable electromagnetic radiation comprises second harmonic or subsequent harmonic frequency waves backscattered from a sensor-emitter element, label, or film comprising the device.

24. The method of claim 15, wherein causing or inducing the current comprises generating an oscillating electromagnetic field or wave in a detection zone, the oscillating electromagnetic field or wave having a fundamental frequency, and allowing the device to be brought into the detection zone.

25. The method of claim 15, wherein the device is nonlinearly polarized in response to an applied electromagnetic field having sufficient strength and an effective oscillation frequency to induce the current in the device.

26. The method of claim 15, further comprising attaching, affixing, or including the device on or in the item.

27. The method of claim 15, comprising deactivating the device by applying a radio frequency electromagnetic field to the device sufficient to induce a voltage differential of from 4 to 50 V in a capacitor in the device.

28. The method of claim 15, wherein the insulating layer comprises a dielectric metal oxide film having a breakdown voltage of from 10 to 20 V.

* * * * *